(12) United States Patent
Jin et al.

(10) Patent No.: US 12,507,344 B2
(45) Date of Patent: Dec. 23, 2025

(54) MAGNETIC ASSEMBLY AND POWER MODULE WITH SAME

(71) Applicant: Delta Electronics, Inc., Taoyuan (TW)

(72) Inventors: Da Jin, Taoyuan (TW); Yang Leng, Taoyuan (TW); Zhongwang Yang, Taoyuan (TW); Qinghua Su, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 1288 days.

(21) Appl. No.: 17/167,329

(22) Filed: Feb. 4, 2021

(65) Prior Publication Data

US 2021/0272737 A1    Sep. 2, 2021

(30) Foreign Application Priority Data

Feb. 27, 2020   (CN) .......................... 202010123504.8
Oct. 14, 2020   (CN) .......................... 202011095569.2

(51) Int. Cl.
*H01F 27/28*    (2006.01)
*H01F 27/26*    (2006.01)
(Continued)

(52) U.S. Cl.
CPC ........... *H05K 1/145* (2013.01); *H01F 27/266* (2013.01); *H01F 27/2804* (2013.01);
(Continued)

(58) Field of Classification Search
CPC ......... H01F 30/10; H01F 30/12; H01F 38/38; H01F 38/32; H01F 29/08; H01F 27/266;
(Continued)

(56) References Cited

U.S. PATENT DOCUMENTS 5,266,916 A    11/1993  Kijima
5,602,554 A *   2/1997  Cepas .................... H01Q 1/248
                                                   342/368
(Continued)

FOREIGN PATENT DOCUMENTS

CN    101017730 A      8/2007
CN    101841244 A *   9/2010
(Continued)

OTHER PUBLICATIONS

Technical Bulletin, "Step-gap "E" core swing chokes", Magnetic, Inc. Technical Bulletin—Bulletin FC-S4, 4pgs (Year: 2001).*

*Primary Examiner* — Tszfung J Chan
(74) *Attorney, Agent, or Firm* — KIRTON McCONKIE; Evan R. Witt

(57) ABSTRACT

A magnetic assembly includes a magnetic core, four primary windings and four secondary windings. The magnetic core includes four lateral legs. The four primary windings and the corresponding secondary windings are magnetically coupled with each other, and the four primary windings and the corresponding secondary windings are wound on the corresponding lateral legs. The winding directions of the four secondary windings on the corresponding lateral legs are identical. A phase difference between a magnetic flux flowing through a specified lateral leg of the four lateral legs and a magnetic flux flowing through an adjacent lateral leg is any value in the range between 150 degrees and 210 degrees. A phase difference between the magnetic flux flowing through the specified lateral leg and the magnetic flux flowing through another adjacent lateral leg is any value in the range between 60 degrees and 120 degrees.

6 Claims, 14 Drawing Sheets

(51) Int. Cl.
*H01F 27/29* (2006.01)
*H01F 27/34* (2006.01)
*H05K 1/11* (2006.01)
*H05K 1/14* (2006.01)
*H05K 1/16* (2006.01)
*H05K 1/18* (2006.01)
*H05K 3/34* (2006.01)

(52) U.S. Cl.
CPC ............ *H01F 27/29* (2013.01); *H01F 27/34* (2013.01); *H05K 1/111* (2013.01); *H05K 1/144* (2013.01); *H05K 1/165* (2013.01); *H05K 1/181* (2013.01); *H05K 3/3494* (2013.01); *H05K 2201/086* (2013.01); *H05K 2201/10015* (2013.01); *H05K 2201/10053* (2013.01); *H05K 2201/10189* (2013.01); *H05K 2201/10734* (2013.01)

(58) Field of Classification Search
CPC ...... H01F 27/2804; H01F 27/29; H01F 27/34; H01F 17/0013; H01F 2027/2809; H01F 17/0006; H01F 5/003; H01F 27/38; H01F 27/24; H01F 27/28; H05K 1/145; H05K 1/111; H05K 1/144; H05K 1/165; H05K 1/181; H05K 3/3494; H05K 2201/086; H05K 2201/10015; H05K 2201/10053; H05K 2201/10189; H05K 2201/10734
USPC .................................................. 336/200, 232
See application file for complete search history.

(56) References Cited

U.S. PATENT DOCUMENTS

| | | | |
|---|---|---|---|
| 6,459,605 | B1 | 10/2002 | Reichard |
| 7,187,263 | B2 | 3/2007 | Vinciarelli |
| 8,035,472 | B2 * | 10/2011 | Vail .................... H01F 41/0246 336/212 |
| 8,531,841 | B2 | 9/2013 | Lee |
| 9,387,633 | B1 | 7/2016 | Vinciarelli et al. |
| 9,729,059 | B1 | 8/2017 | Parto |
| 10,062,499 | B2 | 8/2018 | Ji et al. |
| 11,201,560 | B2 | 12/2021 | Sakata |
| 2003/0174037 | A1 | 9/2003 | Hooey et al. |
| 2005/0083665 | A1 | 4/2005 | Nakashima et al. |
| 2007/0152795 | A1 | 7/2007 | Zeng et al. |
| 2009/0085702 | A1 | 4/2009 | Zeng et al. |
| 2010/0164670 | A1 | 7/2010 | Nakahori et al. |
| 2010/0321960 | A1 * | 12/2010 | Nakahori .......... H02M 3/33573 363/21.04 |
| 2011/0273257 | A1 | 11/2011 | Ishizawa |
| 2015/0282370 | A1 | 10/2015 | Yang et al. |
| 2016/0128179 | A1 | 5/2016 | Okamoto et al. |
| 2016/0268034 | A1 | 9/2016 | Subat et al. |
| 2017/0330678 | A1 | 11/2017 | Harrison |
| 2018/0159430 | A1 | 6/2018 | Albert et al. |
| 2018/0191235 | A1 | 7/2018 | Chen et al. |
| 2018/0226182 | A1 * | 8/2018 | Fe .......................... H01F 27/245 |
| 2019/0019610 | A1 | 1/2019 | Lu et al. |
| 2019/0043660 | A1 * | 2/2019 | Jin .................... H02M 3/33592 |
| 2019/0043661 | A1 * | 2/2019 | Jin ........................ H01F 27/346 |
| 2020/0113058 | A1 | 4/2020 | Xiong et al. |
| 2020/0113059 | A1 | 4/2020 | Xiong et al. |
| 2020/0350117 | A1 * | 11/2020 | Nabih ..................... H01F 27/40 |

FOREIGN PATENT DOCUMENTS

| | | |
|---|---|---|
| CN | 101997416 A | 3/2011 |
| CN | 102611315 A | 7/2012 |
| CN | 103237431 A | 8/2013 |
| CN | 203205229 U | 9/2013 |
| CN | 103427597 A | 12/2013 |
| CN | 103780081 A | 5/2014 |
| CN | 102360808 B | 7/2014 |
| CN | 104205258 A | 12/2014 |
| CN | 103460309 B | 8/2016 |
| CN | 106655721 A | 5/2017 |
| CN | 107437885 A | 12/2017 |
| CN | 109390118 A | 2/2019 |
| CN | 109391156 A | 2/2019 |
| CN | 107077951 B | 5/2019 |
| CN | 111092536 A | 5/2020 |
| CN | 212486379 U | 2/2021 |
| EP | 1495475 A1 | 1/2005 |
| EP | 3576116 A1 | 12/2019 |
| JP | H0723559 A | 1/1995 |
| JP | 2007088131 A * | 4/2007 |
| JP | 2012220375 A * | 11/2012 |
| JP | 5998774 B2 | 9/2016 |
| WO | 2016088460 A1 | 6/2016 |
| WO | 2019180099 A1 | 9/2019 |

\* cited by examiner

MAGNETIC ASSEMBLY AND POWER MODULE WITH SAME

CROSS-REFERENCE TO RELATED APPLICATION

This application claims priority to China Patent Application No. 202010123504.8, filed on Feb. 27, 2020. This application also claims priority to China Patent Application No. 202011095569.2, filed on Oct. 14, 2020. The entire contents of the above-mentioned patent applications are incorporated herein by reference for all purposes.

FIELD OF THE INVENTION

The present disclosure relates to a magnetic assembly and a power module, and more particularly to a magnetic assembly with low cost, small volume and high power density and a power module with the magnetic assembly.

BACKGROUND OF THE INVENTION

With the rapid development of science and technology today, power modules are widely used in different fields, such as telephone communications, data centers, and super-computers. In various fields, power modules are usually used to convert the received electric energy into a regulated voltage in order to power the related electronic devices. Generally, the power module is equipped with a conversion circuit to convert the electric energy. However, in order to meet the requirement of greater output power, the power module is actually equipped with multiple converter circuits connected in parallel to increase the output power of the power module.

The single-phase conversion circuit of the power module includes a primary circuit, a secondary circuit and a magnetic core. In order to meet the requirements of greater output power, the power module needs to include a conversion circuit with two phases or more than two phases. In other words, the power module includes at least two primary circuits, at least two secondary circuits and at least two magnetic cores. However, the arrangement of the at least two magnetic cores increases the fabricating cost of the power module. Moreover, since the conversion circuit with two phases or more than two phases needs a plurality of magnetic cores to electromagnetically couple the primary winding and the secondary winding, the volume of the power module is large and detrimental to miniaturization. Moreover, since the plurality of magnetic cores occupy more space on the system board, the power density of the power module is decreased.

Therefore, there is a need of providing an improved power module in order to overcome the drawbacks of the conventional technologies.

SUMMARY OF THE INVENTION

An object of the present disclosure provides a power module with lower cost, smaller volume and higher power density when compared with the conventional power module.

In accordance with an aspect of the present disclosure, a magnetic assembly is provided. The magnetic assembly includes a magnetic core, four primary windings and four secondary windings. The magnetic core includes an upper core part, a lower core part and four lateral legs. The four lateral legs are disposed between the upper core part and the lower core part. Each of the four primary windings and the corresponding secondary winding of the four secondary windings are magnetically coupled with each other and wound on the corresponding lateral leg of the four lateral legs, so that four transformers are defined by the magnetic core, the four primary windings and the four secondary windings collaboratively. The winding directions of the four secondary windings on the corresponding lateral legs are identical. A phase difference between a magnetic flux flowing through a specified lateral leg of the four lateral legs and a magnetic flux flowing through an adjacent lateral leg is any value in the range between 150 degrees and 210 degrees. A phase difference between the magnetic flux flowing through the specified lateral leg and the magnetic flux flowing through another adjacent lateral leg is any value in the range between 60 degrees and 120 degrees.

In accordance with another aspect of the present disclosure, a power module includes two phase conversion circuits, a first circuit board, a magnetic core and two first power connectors. Each of the two phase conversion circuits includes at least two primary switches, two secondary switches, two primary windings and two secondary windings, wherein the at least two primary switches are electrically connected with the two primary windings, the two secondary switches are electrically connected with the two secondary windings, and the two primary windings are magnetically coupled with the corresponding secondary windings. The first circuit board has a first surface, a second surface and at least one first perforation, wherein the two secondary switches of each of the two phase conversion circuits are disposed on the first circuit board. The magnetic core includes an upper core part, a lower core part, four lateral legs, a first lateral wall and a second lateral wall, wherein the four lateral legs are disposed between the upper core part and the lower core part, the four lateral legs are respectively penetrated through the at least one first perforation, the first circuit board is clamped between the upper core part and the lower core part, and the first lateral wall and the second lateral wall are opposed to each other. Two first power connectors are disposed on the second surface of the first circuit board, wherein each of the two first power connectors comprises a first connector unit and a second connector unit, and the first connector unit and the second connector unit are electrically connected with a positive output terminal and a negative output terminal of the power module, respectively. The two secondary switches of one of the two phase conversion circuits and one of the two first power connectors are located beside the first lateral wall of the magnetic core, and the two secondary switches of the other of the two phase conversion circuits and the other of the two first power connectors are located beside the second lateral wall of the magnetic core. Each of the at least two primary windings and the corresponding secondary winding of the two secondary windings in each of the two phase conversion circuits are magnetically coupled with each other and wound on the corresponding lateral leg of the four lateral legs, so that four transformers are defined. Winding directions of the two secondary windings on the corresponding lateral legs in each of the two phase conversion circuits are identical. An AC voltage applied across each of the at least two primary windings forms a magnetic flux flowing through the corresponding lateral leg of the four lateral legs, and the magnetic fluxes flowing through any two of the four lateral legs have phase differences. A phase difference between a magnetic flux flowing through a specified lateral leg of the four lateral legs and a magnetic flux flowing through an adjacent lateral leg is any value in the range between 150 degrees and 210 degrees, and a phase difference between the magnetic flux flowing through the specified lateral leg and the magnetic flux flowing through another adjacent lateral leg is any value in the range between 60 degrees and 120 degrees.

From the above descriptions, the present disclosure provides the power module. Since a single magnetic core is shared by the two parallel-connected phase conversion circuits, the power module is cost-effective. Due to the arrangement of the single magnetic core, the primary windings and the secondary windings of the first phase conversion circuit are magnetically coupled with each other, and the primary windings and the secondary windings of the second phase conversion circuit are magnetically coupled with each other. According to a magnetic integration technology, the four primary windings and the four secondary windings of the power module are formed as two magnetic integration transformers. Consequently, the volume of the transformer is smaller. Since the layout space of the transformers on the first circuit board is small, more components can be disposed on the first circuit board and the power density of the power module is enhanced. Since the primary switches are disposed on the second circuit board, the first circuit board has more space to dispose the primary windings and the secondary windings. In such way, the widths of the traces for the primary windings and the secondary windings can be increased. Consequently, the power loss of the transformer is reduced, and the power density of the power module is increased.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
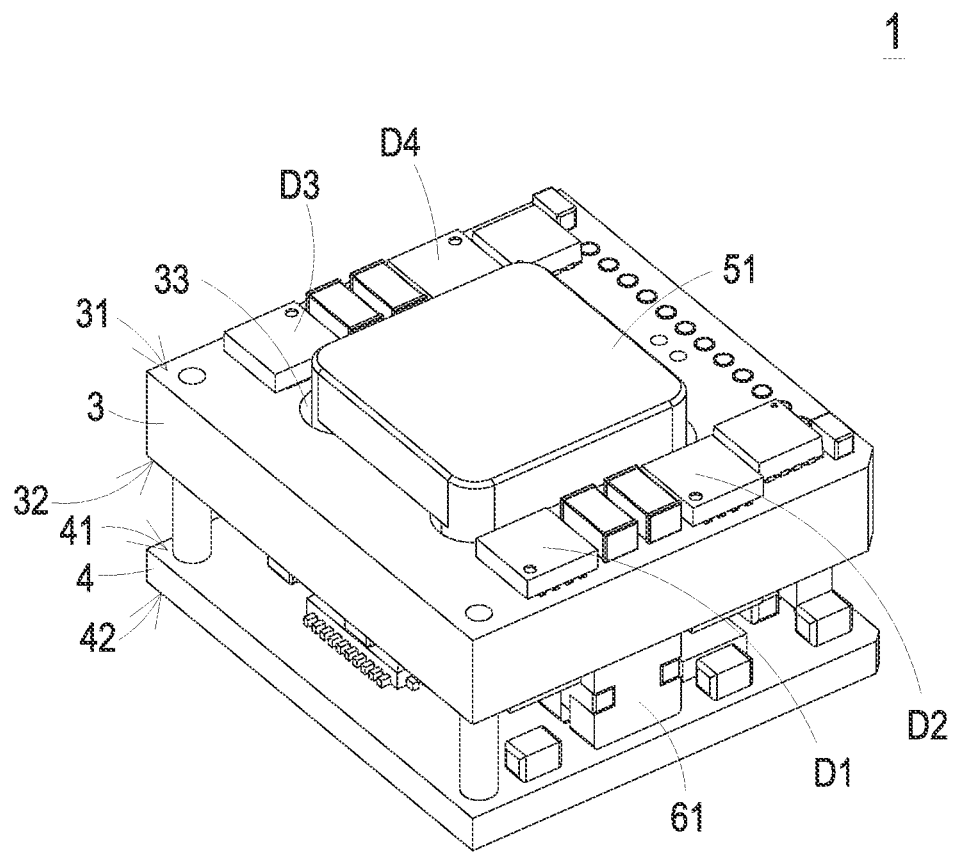
FIG. 1 is a schematic perspective view illustrating a power module according to an embodiment of the present disclosure.
Figure 2:
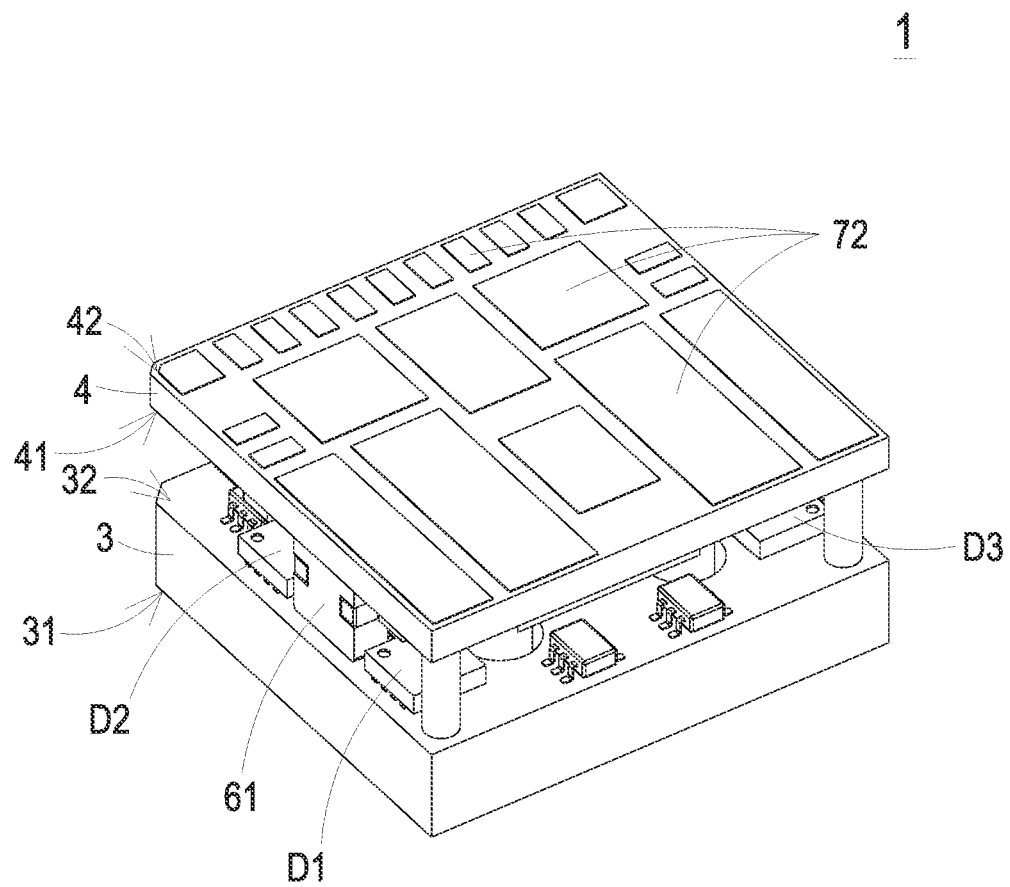
FIG. 2 is a schematic perspective view illustrating the power module as shown in FIG. 1 and taken along another viewpoint.
Figure 3:
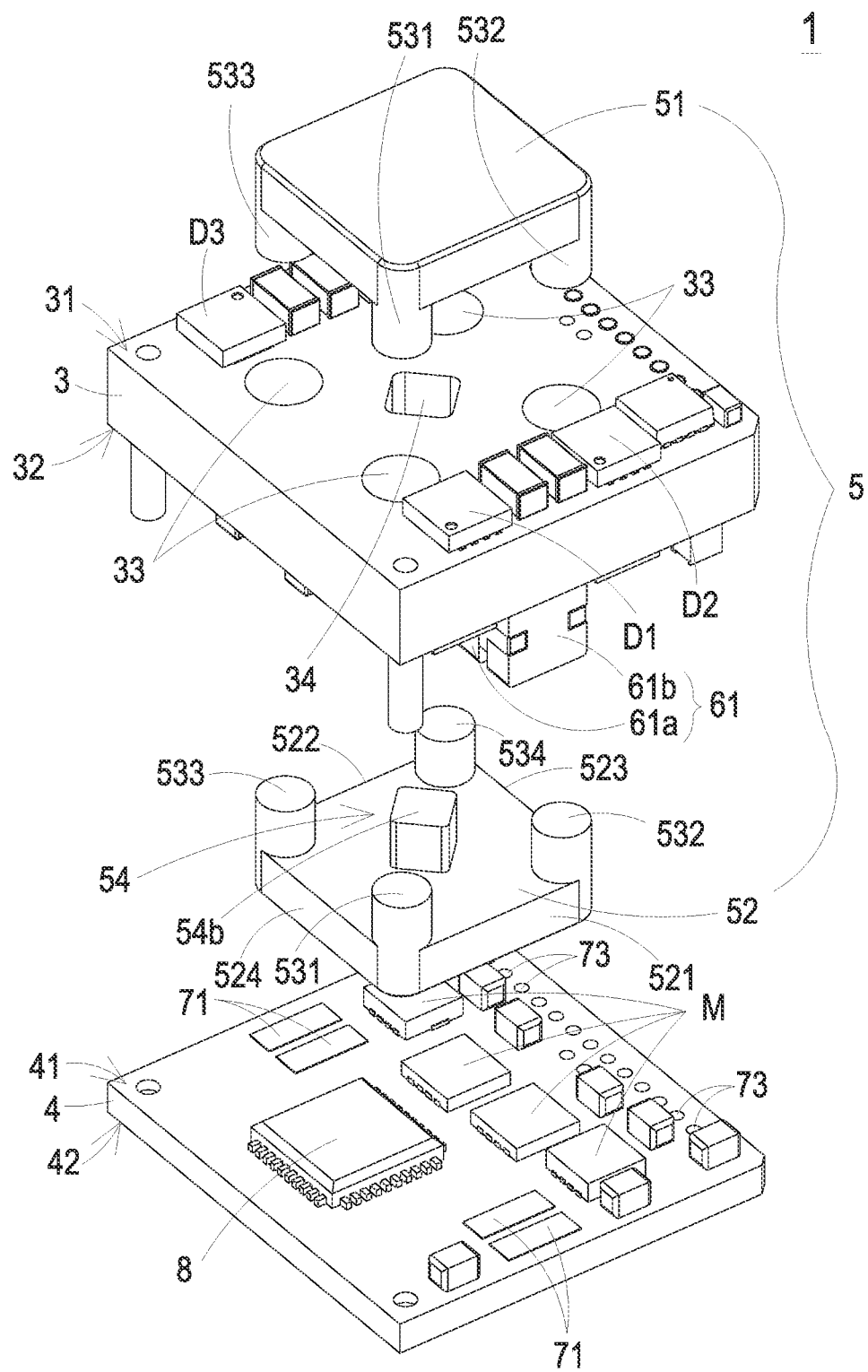
FIG. 3 is a schematic exploded view illustrating the power module as shown in FIG. 1.
Figure 4:
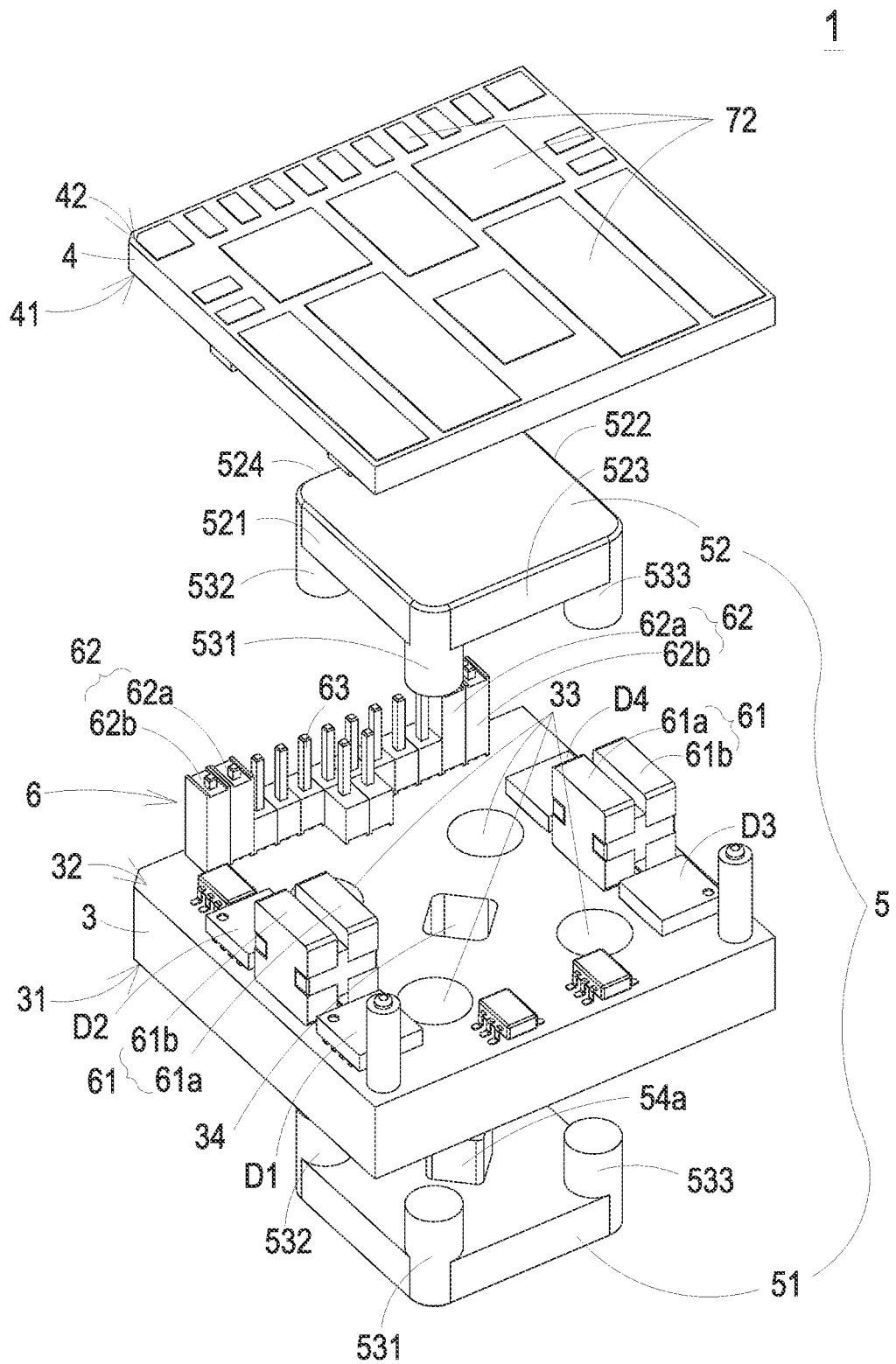
FIG. 4 is a schematic exploded view illustrating the power module as shown in FIG. 1 and taken along another viewpoint.
Figure 5:
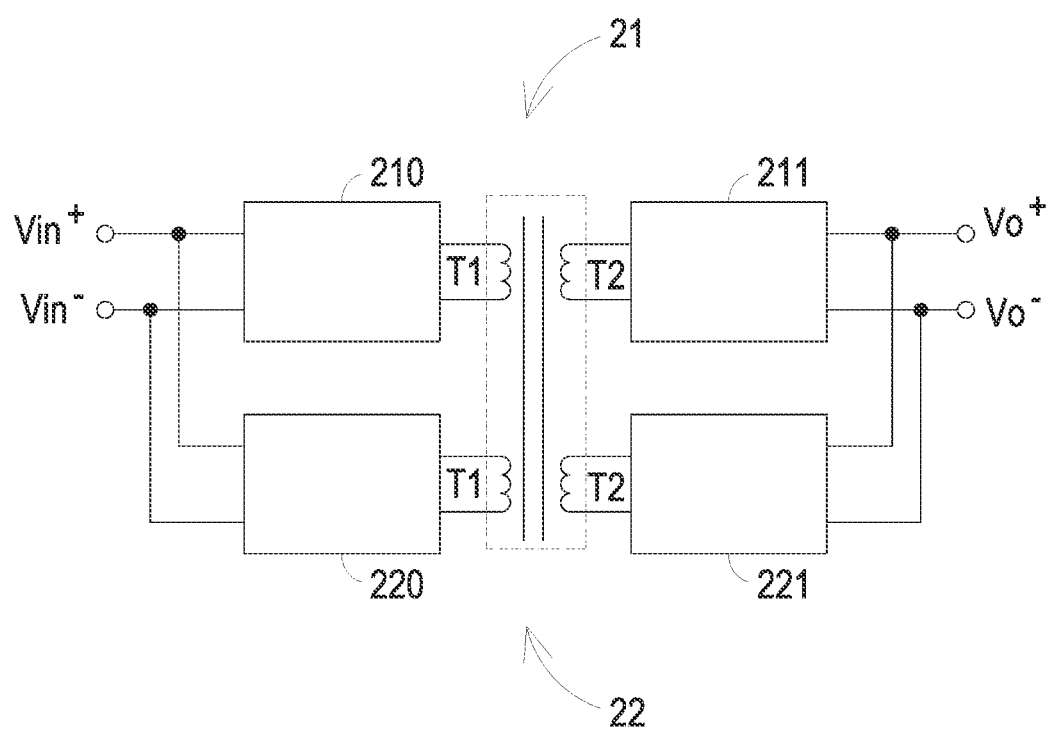
FIG. 5 is an equivalent circuit of the power module as shown in FIG. 1.
Figure 6:
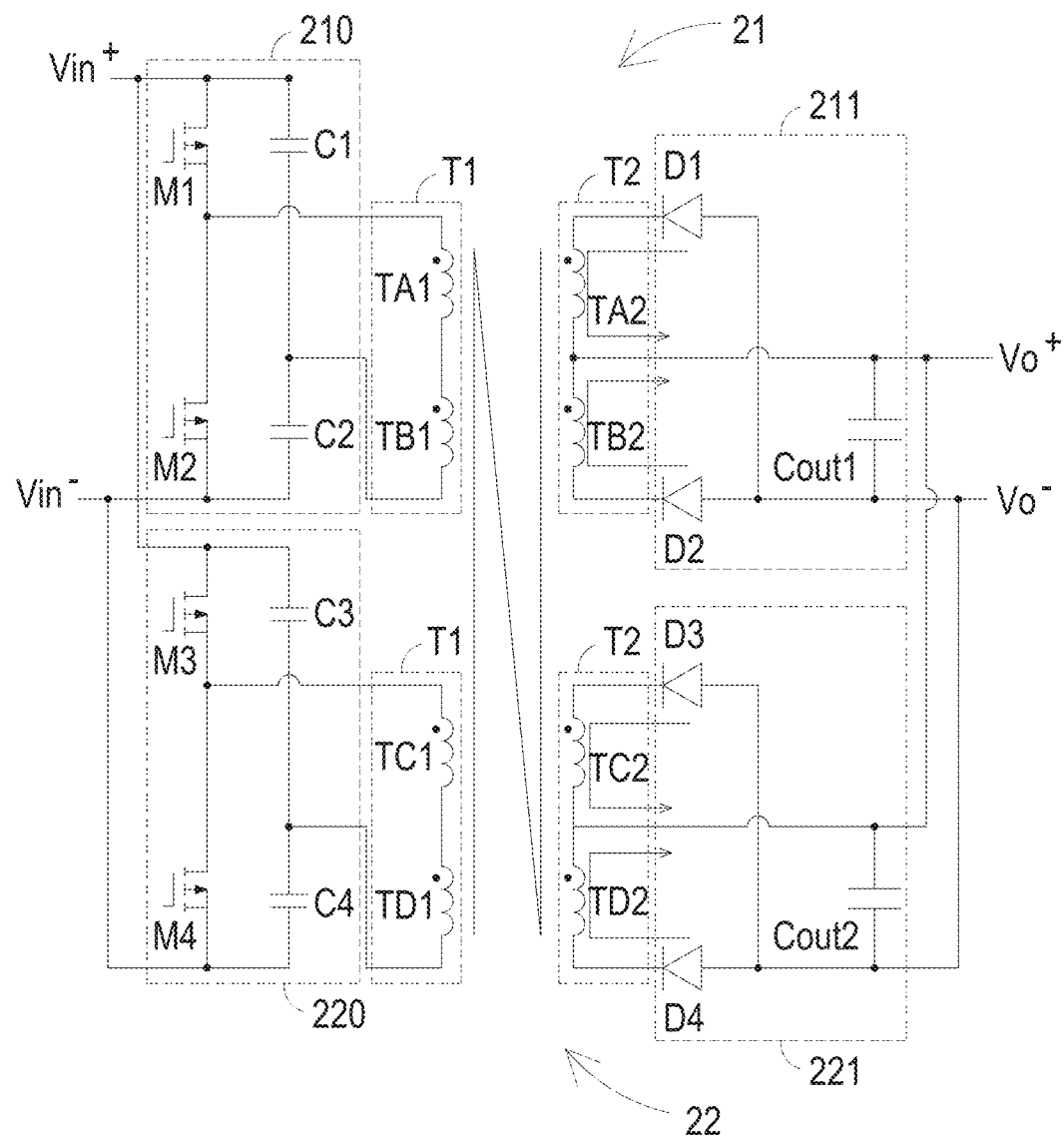
FIG. 6 schematically illustrates the detailed circuitry structure of the equivalent circuit of the power module as shown in FIG. 1.
Figure 6:
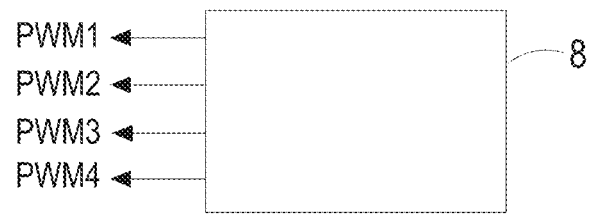

FIG. 1 is a schematic perspective view illustrating a power module according to an embodiment of the present disclosure. FIG. 2 is a schematic perspective view illustrating the power module as shown in FIG. 1 and taken along another viewpoint. FIG. 3 is a schematic exploded view illustrating the power module as shown in FIG. 1. FIG. 4 is a schematic exploded view illustrating the power module as shown in FIG. 1 and taken along another viewpoint. FIG. 5 is an equivalent circuit of the power module as shown in FIG. 1. FIG. 6 schematically illustrates the detailed circuitry structure of the equivalent circuit of the power module as shown in FIG. 1. The power module 1 is disposed in an electronic device (not shown) and welded on a system board (not shown) within the electronic device. In this embodiment, the power module 1 includes two phase conversion circuits, for example a first phase conversion circuit 21 and a second phase conversion circuit 22 as shown in FIGS. 5 and 6.

As shown in FIG. 5, the first phase conversion circuit 21 includes a primary circuit 210, a secondary circuit 211, at least one primary winding T1 and at least one secondary winding T2. The second phase conversion circuit 22 includes a primary circuit 220, a secondary circuit 221, at least one primary winding T1 and at least one secondary winding T2. The primary winding T1 and the secondary winding T2 of the first phase conversion circuit 21 and the primary winding T1 and the secondary winding T2 of the second phase conversion circuit 22 are wound on the same magnetic core. Due to the magnetic coupling effect, the magnetic loss is decreased, and the size of the magnetic core is reduced. The method of winding the windings of the two phase conversion circuits on the magnetic core will be described later.

As shown in FIG. 6, the primary circuit 210 of the first phase conversion circuit 21 includes a first primary switch M1, a second primary switch M2 and two input capacitors C1, C2. The secondary circuit 211 of the first phase conversion circuit 21 includes a first secondary switch D1, a second secondary switch D2 and an output capacitor Cout1. In an embodiment, the first phase conversion circuit 21 includes two primary windings T1, including a first primary winding TA1 and a second primary winding TB1. The first phase conversion circuit 21 includes two secondary windings T2, including a first secondary winding TA2 and a second secondary winding TB2.

The second terminal of the first primary winding TA1 and the first terminal of the second primary winding TB1 are connected with each other in series. That is, a first primary winding branch circuit is defined by the first primary winding TA1 and the second primary winding TB1 collaboratively. The first terminal of the first primary winding TAL is a first terminal of the first primary winding branch circuit. The second terminal of the second primary winding TB1 is a second terminal of the first primary winding branch circuit.

The first primary switch M1 and the second primary switch M2 are electrically connected with each other and collaboratively defined as a first primary switch bridge arm. That is, the second terminal of the first primary switch M1 and the first terminal of the second primary switch M2 are connected to a midpoint of the first primary switch bridge arm.

The input capacitor C1 and the input capacitor C2 are electrically connected with each other and collaboratively defined as a first capacitor bridge arm. That is, the second terminal of the input capacitor C1 and the first terminal of the input capacitor C2 are connected with a midpoint of the first capacitor bridge arm. The first terminal of the input capacitor C1 is electrically connected with the first terminal of the first primary switch M1. The second terminal of the input capacitor C2 is electrically connected to the second terminal of the second primary switch M2.

The first terminal of the first primary winding branch circuit is electrically connected with the midpoint of the first primary switch bridge arm. The second terminal of the first primary winding branch circuit is electrically connected with the midpoint of the first capacitor bridge arm.

Consequently, the primary side of the first phase conversion circuit 21 includes the first primary winding TA1, the second primary winding TB1, the first primary switch M1, the second primary switch M2 and the two input capacitors C1, C2.

The first terminal of the first secondary winding TA2 is electrically connected to the cathode of the first secondary switch D1. The second terminal of the first secondary winding TA2 is electrically connected to the first terminal of the second secondary winding TB2. The second terminal of the second secondary winding TB2 is electrically connected to the cathode of the second secondary switch D2. The secondary side of the first phase conversion circuit 21 includes the first secondary winding TA2, the second secondary winding TB2, the first secondary switch D1, the second secondary switch D2 and the output capacitor Cout1. In addition, the first secondary winding TA2, the second secondary winding TB2, the first secondary switch D1 and the second secondary switch D2 are collaboratively formed as a center-tapped rectifier circuit. The first terminal of the output capacitor Cout1 is electrically connected between the first secondary winding TA2 and the second secondary winding TB2. The second terminal of the output capacitor Cout1 is electrically connected to the anode of the first secondary switch D1 and the anode of the second secondary switch D2. The first primary winding TA1 and the first secondary winding TA2 are magnetically coupled to each other. The second primary winding TB1 and the second secondary winding TB2 are magnetically coupled to each other. The first primary winding TA1 and the first secondary winding TA2 are wound on a first leg of the magnetic core, and the second primary winding TB1 and the second secondary winding TB2 are wound on a second leg of the magnetic core.

Please refer to FIG. 6 again. The primary circuit 220 of the second phase conversion circuit 22 includes a third primary switch M3, a fourth primary switch M4 and two input capacitors C3, C4. The secondary circuit 221 of the second phase conversion circuit 22 includes a third secondary switch D3, a fourth secondary switch D4 and an output capacitor Cout2. In an embodiment, the second phase conversion circuit 22 includes two primary windings T1, including a third primary winding TC1 and a fourth primary winding TD1. The second phase conversion circuit 22 includes two secondary windings T2, including a third secondary winding TC2 and a fourth secondary winding TD2.

The second terminal of the third primary winding TC1 and the first terminal of the fourth primary winding TD1 are connected with each other in series. That is, a second primary winding branch circuit is defined by the third primary winding TC1 and the fourth primary winding TD1 collaboratively. The first terminal of the third primary winding TC1 is a first terminal of the second primary winding branch circuit. The second terminal of the fourth primary winding TD1 is a second terminal of the second primary winding branch circuit.

The third primary switch M3 and the fourth primary switch M4 are electrically connected with each other and collaboratively defined as a second primary switch bridge arm. That is, the second terminal of the third primary switch M3 and the first terminal of the fourth primary switch M4 are connected to a midpoint of the second primary switch bridge arm.

The input capacitor C3 and the input capacitor C4 are electrically connected with each other and collaboratively defined as a second capacitor bridge arm. That is, the second terminal of the input capacitor C3 and the first terminal of the input capacitor C4 are connected with a midpoint of the second capacitor bridge arm. The first terminal of the input capacitor C3 is electrically connected with the first terminal of the third primary switch M3. The second terminal of the input capacitor C4 is electrically connected to the second terminal of the fourth primary switch M4. The first terminal of the second primary winding branch circuit is electrically connected with the midpoint of the second primary switch bridge arm. The second terminal of the second primary winding branch circuit is electrically connected with the midpoint of the second capacitor bridge arm.

Consequently, the primary side of the second phase conversion circuit 22 includes the third primary winding TC1, the fourth primary winding TD1, the third primary switch M3, the fourth primary switch M4 and the two input capacitors C3, C4.

The first terminal of the third primary winding TC2 is electrically connected to the cathode of the third secondary switch D3. The second terminal of the third primary winding TC2 is electrically connected to the first terminal of the fourth primary winding TD2. The second terminal of the fourth primary winding TD2 is electrically connected to the cathode of the fourth secondary switch D4. The secondary side of the second phase conversion circuit 22 includes the third secondary winding TC2, the fourth secondary winding TD2, the third secondary switch D3, the fourth secondary switch D4 and the output capacitor Cout2. In addition, the third secondary winding TC2, the fourth secondary winding TD2, the third secondary switch D3 and the fourth secondary switch D4 are collaboratively formed as a center-tapped rectifier circuit. The first terminal of the output capacitor Cout2 is electrically connected between the third secondary winding TC2 and the fourth secondary winding TD2. The second terminal of the output capacitor Cout2 is electrically connected to the anode of the third secondary switch D3 and the anode of the fourth secondary switch D4. The third primary winding TC1 and the third secondary winding TC2 are magnetically coupled to each other. The fourth primary winding TD1 and the fourth secondary winding TD2 are magnetically coupled to each other. The third primary winding TC1 and the third secondary winding TC2 are wound on a third leg of the magnetic core, and the fourth primary winding TD1 and the fourth secondary winding TD2 are wound on a fourth leg of the magnetic core.

Please refer to FIGS. 5 and 6 again. In this embodiment, the primary circuit 210 of the first phase conversion circuit 21 and the primary circuit 220 of the second phase conversion circuit 22 are connected with each other in parallel. The input side of the power module 1 includes a positive input terminal Vin+ and a negative input terminal Vin−. The secondary circuit 211 of the first phase conversion circuit 21 and the secondary circuit 221 of the second phase conversion circuit 22 are connected with each other in parallel. The output side of the power module 1 includes a positive output terminal Vo+ and a negative output terminal Vo−. The output capacitor Cout1 of the first phase conversion circuit 21 is electrically connected between the positive output terminal Vo+ and the negative output terminal Vo−. The output capacitor Cout2 of the second phase conversion circuit 22 is electrically connected between the positive output terminal Vo+ and the negative output terminal Vo−.

It is noted that the connections between the first phase conversion circuit 21, the second phase conversion circuit 22, the positive input terminal Vin+, the negative input terminal Vin−, the positive output terminal Vo+ and the negative output terminal Vo− may be varied according to the practical requirements. In another embodiment, the primary circuit 210 of the first phase conversion circuit 21 and the primary circuit 220 of the second phase conversion circuit 22 are parallel-connected between the positive input terminal Vin+ and the negative input terminal Vin−, and the secondary circuit 211 of the first phase conversion circuit 21 and the secondary circuit 221 of the second phase conversion circuit 22 are serially connected between the positive output terminal Vo+ and the negative output terminal Vo−. Alternatively, the primary circuit 210 of the first phase conversion circuit 21 and the primary circuit 220 of the second phase conversion circuit 22 are serially connected between the positive input terminal Vin+ and the negative input terminal Vin−, and the secondary circuit 211 of the first phase conversion circuit 21 and the secondary circuit 221 of the second phase conversion circuit 22 are serially connected or parallel-connected between the positive output terminal Vo+ and the negative output terminal Vo−. Due to the magnetic coupling effect, the first phase conversion circuit 21 and the second phase conversion circuit 22 are coupled with each other. The primary circuit 210 of the first phase conversion circuit 21 and the primary circuit 220 of the second phase conversion circuit 22 are full-bridge circuits or half-bridge circuits. The secondary circuit 211 of the first phase conversion circuit 21 and the secondary circuit 221 of the second phase conversion circuit 22 are center-tapped rectifier circuits or full-bridge rectifier circuits. In order to increase the output power and reduce the parasitic resistance of the windings, each of the primary winding and the secondary winding include two windings. The two windings are connected in series or parallel.

Hereinafter, the structure of the power module 1 will be described with reference to FIGS. 1, 2, 3 and 4.

The power module 1 includes four primary windings, four secondary windings, a first circuit board 3, a second circuit board 4, a magnetic core 5, four primary switches M, four secondary switches and a connection element 6. The four primary switches M include a first primary switch M1, a second primary switch M2, a third primary switch M3 and a fourth primary switch M4 (see FIG. 6). The four secondary switches include a first secondary switch D1, a second secondary switch D2, a third secondary switch D3 and a fourth secondary switch D4 (see FIG. 6).

As shown in FIGS. 1 to 4, the first circuit board 3 has a first surface 31 and a second surface 32, which are opposed to each other. The first circuit board 3 includes four first perforations 33 and a second perforation 34. The four first perforations 33 and the second perforation 34 run through the first circuit board 3, respectively. The second circuit board 4 has a first surface 41 and a second surface 42, which are opposed to each other. The first surface 41 of the second circuit board 4 is adjacent to the second surface 32 of the first circuit board 3. The second surface 42 of the second circuit board 4 is attached on a system board of the electronic device.

The connection element 6 is disposed between the first circuit board 3 and the second circuit board 4. Moreover, the connection element 6 is connected with the first circuit board 3 and the second circuit board 4.

The magnetic core 5 includes an upper core part 51, a lower core part 52, a first lateral leg 531, a second lateral leg 532, a third lateral leg 533, a fourth lateral leg 534 and a middle leg 54.

The first lateral leg 531, the second lateral leg 532, the third lateral leg 533 and the fourth lateral leg 534 are in a quadrilateral arrangement. The first lateral leg 531 and the fourth lateral leg 534 are respectively located at two opposite corners along a diagonal line. The second lateral leg 532 and the third lateral leg 533 are respectively located at two opposite corners along another diagonal line. The first lateral leg 531 is located beside the second lateral leg 532 and the third lateral leg 533, and the fourth lateral leg 534 is located beside the second lateral leg 532 and the third lateral leg 533. Each lateral leg includes an upper leg segment and a lower leg segment. The four primary windings and the corresponding secondary windings are wound on the corresponding lateral legs, respectively.

The upper core part 51 is disposed on the first surface 31 of the first circuit board 3. The lower core part 52 is disposed on the second surface 32 of the first circuit board 3, and the lower core part 52 is disposed between the first circuit board 3 and the second circuit board 4. Moreover, portions of the lateral legs 531, 532, 533 and 534 are formed on the upper core part 51, and the other portions of the lateral legs 531, 532, 533 and 534 are formed on the lower core part 52. The lateral legs 531, 532, 533 and 534 are penetrated through the corresponding first perforations 33 of the first circuit board 3. The middle leg 54 is penetrated through the second perforation 34 of the first circuit board 3. Consequently, the first circuit board 3 is clamped between the upper core part 51 and the lower core part 52. The magnetic core 5 is magnetically coupled with the four primary windings and the four secondary windings so as to form four transformers.

In this embodiment, the four primary windings, the four secondary windings and the magnetic core 5 are collaboratively formed as a magnetic assembly.

In an embodiment, the four primary windings and the four secondary windings are wiring parts that are formed within the first circuit board 3. Alternatively, the four primary windings and the four secondary windings are copper posts that are embedded in the first circuit board 3. The upper core part 51, the lower core part 52 and the lateral legs 531, 532, 533 and 534 are made of ferrite or iron powder. In an embodiment, the middle leg 54 has a stepped air gap, and the middle leg 54 is made of ferrite. In another embodiment, the middle leg 54 has a distributed air gap, and the middle leg 54 is made of iron powder.

Figure 7:
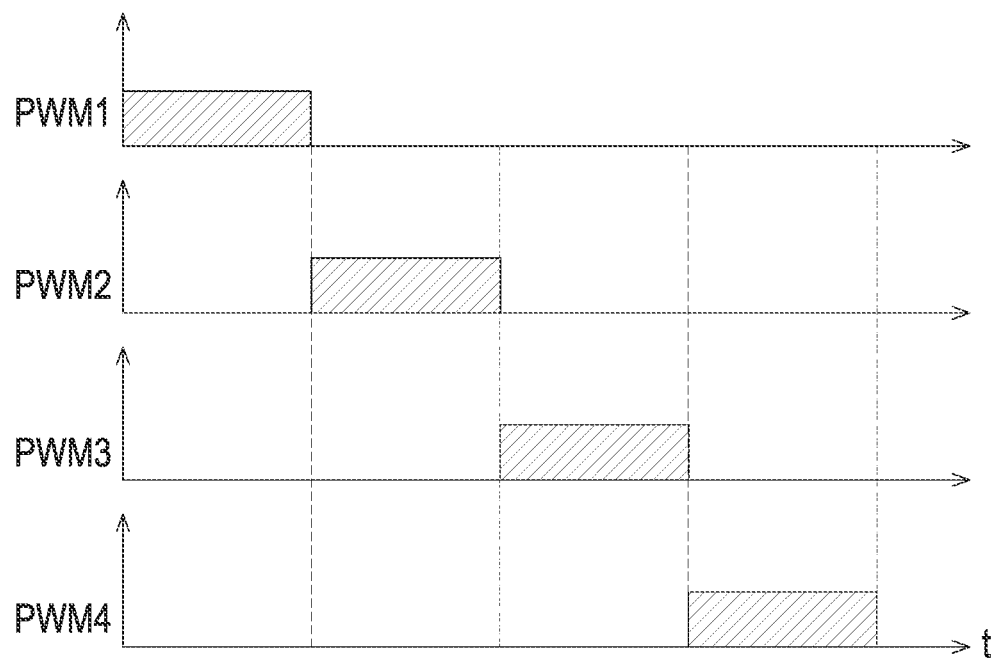
FIG. 7 is a schematic timing waveform diagram illustrating the sequence of controlling the power system of the present invention according to the control signals.

Please refer to FIG. 7 and FIGS. 1 to 6. FIG. 7 is a schematic timing waveform diagram illustrating the sequence of controlling the power module of the present disclosure according to the control signals. The power module 1 further includes a controller 8 (see FIG. 3). The controller 8 is disposed on the first surface 41 of the second circuit board 4. After the controller 8 samples the output voltage and the output current of the power module 1, the controller 8 generates four pulse width modulation signals PWM1, PWM2, PWM3 and PWM4, which are also referred as control signals. The first phase conversion circuit 21 is controlled according to the pulse width modulation signals PWM1 and PWM3. The second phase conversion circuit 22 is controlled according to the pulse width modulation signals PWM2 and PWM4. The phase difference between the pulse width modulation signals PWM1 and PWM3 is 180 degrees. The phase difference between the pulse width modulation signals PWM2 and PWM4 is 180 degrees. The phase difference between the pulse width modulation signals PWM1 and PWM2 is 90 degrees. The phase difference between the pulse width modulation signals PWM3 and PWM4 is 90 degrees.

For example, the first primary switch M1 of the first phase conversion circuit 21 is controlled according to the pulse width modulation signal PWM1, and the second primary switch M2 of the first phase conversion circuit 21 is controlled according to the pulse width modulation signal PWM3. Moreover, the third primary switch M3 of the second phase conversion circuit 22 is controlled according to the pulse width modulation signal PWM2, and the fourth primary switch M4 of the second phase conversion circuit 22 is controlled according to the pulse width modulation signal PWM4. The phase difference between the pulse width modulation signals PWM1 and PWM3 is 180 degrees. The phase difference between the pulse width modulation signals PWM2 and PWM4 is 180 degrees. The phase difference between the pulse width modulation signals PWM1 and PWM2 is 90 degrees. The phase difference between the pulse width modulation signals PWM3 and PWM4 is 90 degrees. In other words, the phase difference between control signals PWM1 and PWM3 for controlling the first primary switch M1 and the second primary switch M2 is 180 degrees, the phase difference between the control signals PWM2 and PWM4 for controlling the third primary switch M3 and the fourth primary switch M4 is 180 degrees, the phase difference between control signals PWM1 and PWM2 for controlling the first primary switch M1 and the third primary switch M3 is 90 degrees, the phase difference between control signals PWM1 and PWM4 for controlling the first primary switch M1 and the fourth primary switch M4 is 90 degrees, the phase difference between the control signals PWM3 and PWM2 for controlling the second primary switch M2 and the third primary switch M3 is 90 degrees, and the phase difference between the control signals PWM3 and PWM4 for controlling the second primary switch M2 and the fourth primary switch M4 is 90 degrees. In an embodiment, the duty cycles of the control signals for controlling the four primary switches are lower than 50%. That is, the duty cycles of the control signals for controlling the first phase conversion circuit 21 and the second phase conversion circuit 22 are lower than 50%. As mentioned above, the controller 8 of the power module 1 can control that the phase difference between control signals for controlling the primary switch of one phase conversion circuit and the corresponding primary switch of the other phase conversion circuit is 90 degrees, and the controller 8 can also control that the phase difference between control signals for controlling the secondary switch of one phase conversion circuit and the corresponding secondary switch of the other phase conversion circuit is 90 degrees.

Since the first phase conversion circuit 21 and the second phase conversion circuit 22 are controlled according to the four pulse width modulation signals PWM1, PWM2, PWM3 and PWM4, the voltage across each primary winding is an AC voltage. As mentioned above, the phase difference between the pulse width modulation signals PWM1 and PWM3 is 180 degrees. Consequently, in the first phase conversion circuit 21, the phase difference between the voltage across the two terminals of the first primary winding TA1 and the voltage across the two terminals of the second primary winding TB1 is 180 degrees. As mentioned above, the phase difference between the pulse width modulation signals PWM2 and PWM4 is 180 degrees. Consequently, in the second phase conversion circuit 22, the phase difference between the voltage across the two terminals of the third primary winding TC1 and the voltage across the two terminals of the fourth primary winding TD1 is 180 degrees. As mentioned above, the phase difference between the pulse width modulation signals PWM1 and PWM2 is 90 degrees. Consequently, the phase difference between the voltage across the two terminals of the first primary winding TA1 and the voltage across the two terminals of the third primary winding TC1 is 90 degrees. As mentioned above, the phase difference between the pulse width modulation signals PWM1 and PWM4 is 90 degrees. Consequently, the phase difference between the voltage across the two terminals of the first primary winding TA1 and the voltage across the two terminals of the fourth primary winding TD1 is 90 degrees. For the second primary winding TA1, the third primary winding TC1 and the fourth primary winding TD1, the rest may be deduced by analogy.

Moreover, a closed magnetic loop is defined by each primary winding, the corresponding lateral leg, the upper core part 51 and the lower core part 52 collaboratively. In response to the AC voltage across each primary winding, the AC magnetic flux flows through the corresponding lateral leg. In other words, the phase difference between the AC magnetic flux flowing through the first primary winding TA1 and the AC magnetic flux flowing through the second primary winding TB1 is 180 degrees, the phase difference between the AC magnetic flux flowing through the first primary winding TA1 and the AC magnetic flux flowing through the third primary winding TC1 is 90 degrees, and the phase difference between the AC magnetic flux flowing through the first primary winding TA1 and the AC magnetic flux flowing through the fourth primary winding TD1 is 90 degrees. Similarly, the phase difference between the AC magnetic flux flowing through the second primary winding TB1 and the AC magnetic flux flowing through the third primary winding TC1 is 90 degrees, and the phase difference between the AC magnetic flux flowing through the second primary winding TB1 and the AC magnetic flux flowing through the fourth primary winding TD1 is 90 degrees. Similarly, the phase difference between the AC magnetic flux flowing through the third primary winding TC1 and the AC magnetic flux flowing through the fourth primary winding TD1 is 180 degrees. Due to the above control mechanism, the ripple of the output voltage from the power module 1 is reduced. Consequently, the power module 1 can be equipped with a small output filter to filter off the ripple of the output voltage.

Figure 8A:
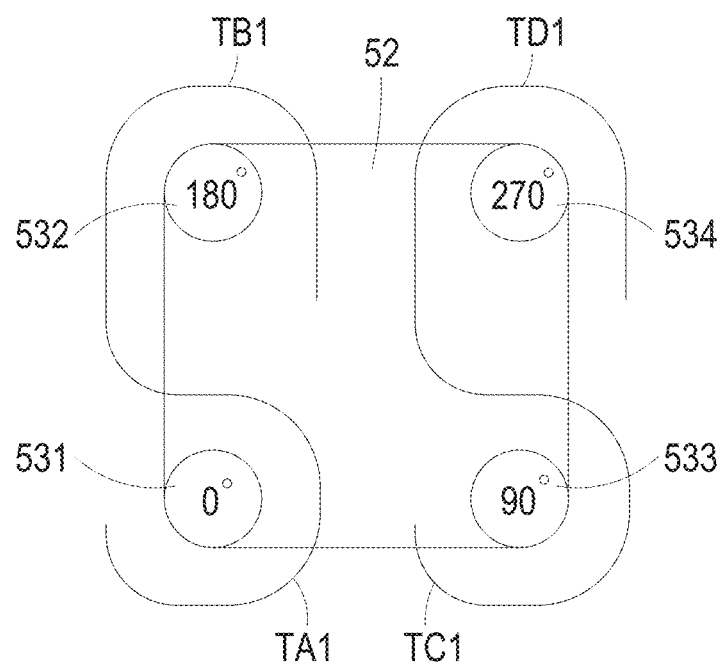
FIG. 8A is schematic cross-sectional view illustrating a method of winding the primary windings on the magnetic core of the power module as shown in FIG. 1.
Figure 8B:
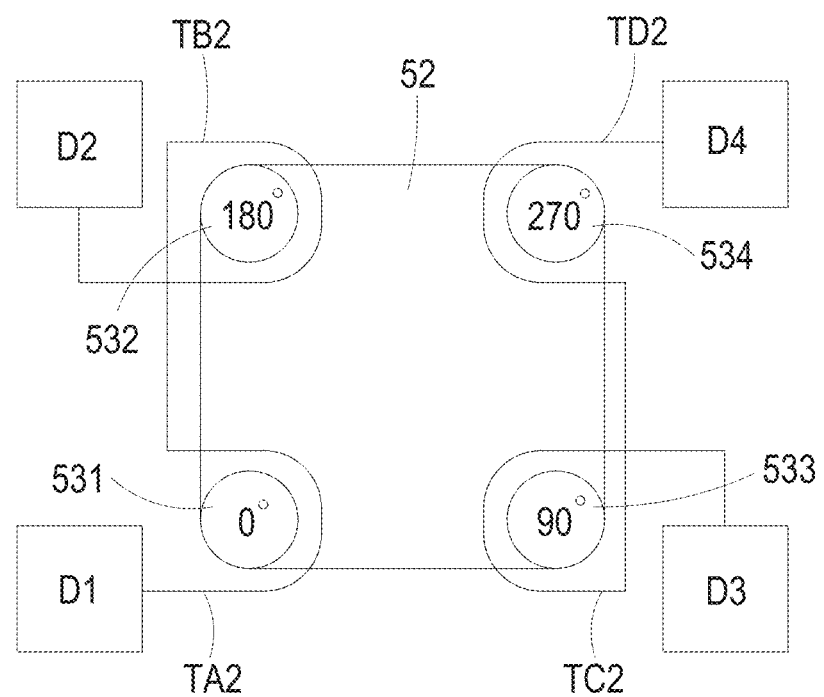
FIG. 8B is schematic cross-sectional view illustrating a method of winding the secondary windings on the magnetic core of the power module as shown in FIG. 1.

Please refer to FIGS. 8A and 8B. FIG. 8A is schematic cross-sectional view illustrating a method of winding the primary windings on the magnetic core of the power module as shown in FIG. 1. FIG. 8B is schematic cross-sectional view illustrating a method of winding the secondary windings on the magnetic core of the power module as shown in FIG. 1. For clearly showing the primary windings, only the primary windings wound on the lateral legs 531, 532, 533 and 534 of the lower core part 52 are shown in FIG. 8A. Similarly, for clearly showing the secondary windings, only the secondary windings wound on the lateral legs 531, 532, 533 and 534 of the lower core part 52 are shown in FIG. 8B. The method of winding the primary windings of the power module 1 on the entire lateral legs and the method of winding the secondary windings of the power module 1 on the entire lateral legs are obvious by referring to the illustrations as shown in FIGS. 8A and 85B. In this embodiment, each of the primary windings and the secondary windings has one turn. It is noted that the method of winding these windings and the turn numbers of these windings are not restricted.

Please refer to FIGS. 8A and 8B again. The first primary winding TA1 and the first secondary winding TA2 are wound on the first lateral leg 531. The second primary winding TB1 and the second secondary winding TB2 are wound on the second lateral leg 532. The third primary winding TC1 and the third secondary winding TC2 are wound on the third lateral leg 533. The fourth primary winding TD1 and the fourth secondary winding TD2 are wound on the fourth lateral leg 534. The winding directions of the first secondary winding TA2, the second secondary winding TB2, the third secondary winding TC2 and the fourth secondary winding TD2 are identical. As shown in FIG. 8B, the first secondary winding TA2, the second secondary winding TB2, the third secondary winding TC2 and the fourth secondary winding TD2 are wound along the counterclockwise direction. As shown on FIG. 8A, the first primary winding TA1 and the second primary winding TB1 are wound on the first lateral leg 531 and the second lateral leg 532 along an S-shaped path, and the third primary winding TC1 and the fourth primary winding TD1 are wound on the third lateral leg 533 and the fourth lateral leg 534 along an S-shaped path.

When the tolerance is taken into consideration, the phase difference between the magnetic flux flowing through the first primary winding TA1 on the first lateral leg 531 and the magnetic flux flowing through the second primary winding TB1 on the second lateral leg 532 is any value in the range between 150 degrees and 210 degrees. For example, the magnetic flux flowing through the first primary winding TA1 on the first lateral leg 531 is 0 degree, and the magnetic flux flowing through the second primary winding TB1 on the second lateral leg 532 is any value in the range between 150 degrees and 210 degrees. For example, the magnetic flux phase difference is 180 degrees. The phase difference between the magnetic flux flowing through the first primary winding TA1 on the first lateral leg 531 and the magnetic flux flowing through the third primary winding TC1 on the third lateral leg 533 is any value in the range between 60 degrees and 120 degrees. For example, the magnetic flux flowing through the first primary winding TA1 on the first lateral leg 531 is 0 degree, and the magnetic flux flowing through the third primary winding TC1 on the third lateral leg 533 is any value in the range between 60 degrees and 120 degrees. For example, the magnetic flux phase difference is 90 degrees. The phase difference between the magnetic flux flowing through the first primary winding TA1 on the first lateral leg 531 and the magnetic flux flowing through the fourth primary winding TD1 on the fourth lateral leg 534 is any value in the range between 240 degrees and 300 degrees. For example, the magnetic flux flowing through the first primary winding TA1 on the first lateral leg 531 is 0 degree, and the magnetic flux flowing through the fourth primary winding TD1 on the fourth lateral leg 534 is any value in the range between 240 degrees and 300 degrees. For example, the magnetic flux phase difference is 270 degrees. The phase difference between the magnetic flux flowing through the third primary winding TC1 on the third lateral leg 533 and the magnetic flux flowing through the fourth primary winding TD1 on the fourth lateral leg 534 is any value in the range between 150 degrees and 210 degrees. For example, the magnetic flux flowing through the third primary winding TC1 on the third lateral leg 533 is 0 degree, and the magnetic flux flowing through the fourth primary winding TD1 on the fourth lateral leg 534 is any value in the range between 150 degrees and 210 degrees. For example, the magnetic flux phase difference is 180 degrees.

In other words, the phase difference between the magnetic flux flowing through the primary winding on a specified lateral leg and the magnetic flux flowing through the primary winding on an adjacent lateral leg is any value in the range between 150 degrees and 210 degrees, and the phase difference between the magnetic flux flowing through the primary winding on the specified lateral leg and the magnetic flux flowing through the primary winding on another adjacent lateral leg is any value in the range between 60 degrees and 120 degrees. Since the primary windings and the secondary windings are wound on the corresponding lateral legs and the magnetic flux angles are specially selected, the magnetic fluxes through the upper core part 51 or the lower core part 52 are partially balanced. Consequently, the thicknesses of the upper core part 51 and the lower core part 52 are reduced, and the size of the power module 1 is reduced.

In an embodiment, the first secondary winding TA2 is wound on the first lateral leg 531 along a counterclockwise direction, and the second secondary winding TB2 is wound on the second lateral leg 532 along a counterclockwise direction. The first terminal of the first secondary winding TA2 is electrically connected with the first terminal of the first secondary switch D1. The second terminal of the first secondary winding TA2 and the first terminal of the second secondary winding TB2 are electrically connected with each other to form a center tap, so that the first secondary winding TA2 and the second secondary winding TB2 are collaboratively formed as a first center-tapped structure. Moreover, the second terminal of the first secondary winding TA2 and the first terminal of the second secondary winding TB2 are connected with the positive output terminal Vo+ of the power module 1. The second terminal of the second secondary winding TB2 is electrically connected with the first terminal of the second secondary switch D2. The second terminal of the first secondary switch D1 and the second terminal of the second secondary switch D2 are electrically connected with each other and connected with the negative output terminal Vo− of the power module 1. Similarly, the third secondary winding TC2 is wound on the third lateral leg 533 along a counterclockwise direction, and the fourth secondary winding TD2 is wound on the fourth lateral leg 534 along a counterclockwise direction. The first terminal of the third secondary winding TC2 is electrically connected with the first terminal of the third secondary switch D3. The second terminal of the third secondary winding TC2 and the first terminal of the fourth secondary winding TD2 are electrically connected with each other to form a center tap, so that the third secondary winding TC2 and the fourth secondary winding TD2 are collaboratively formed as a second center-tapped structure. Moreover, the second terminal of the third secondary winding TC2 and the first terminal of the fourth secondary winding TD2 are connected with the positive output terminal Vo+ of the power module 1. The second terminal of the fourth secondary winding TD2 is electrically connected with the first terminal of the fourth secondary switch D4. The second terminal of the third secondary switch D3 and the second terminal of the fourth secondary switch D4 are electrically connected with each other and connected with the negative output terminal Vo− of the power module 1.

Preferably but not exclusively, each of the four primary switches M is a metal-oxide-semiconductor transistor (MOSFET), a silicon carbide (SiC) switch, a gallium nitride (GaN) switch, a synchronous rectification switch or a Schottky diode. The four primary switches M are fixed on the first surface 41 of the second circuit board 41 through a welding process or a conductive adhesive.

Preferably but not exclusively, each of the four secondary switches D is a metal-oxide-semiconductor transistor (MOSFET), a silicon carbide (SiC) switch, a gallium nitride (GaN) switch, a synchronous rectification switch or a Schottky diode. The four secondary switches D are fixed on the first surface 31 of the first circuit board 3 through a welding process or a conductive adhesive.

The first phase conversion circuit 21 is defined by two of the four primary windings, two of the four secondary windings, two of the four primary switches M, two of the four secondary switches D and the magnetic core 5 collaboratively. The second phase conversion circuit 22 is defined by the other two of the four primary windings, the other two of the four secondary windings, the other two of the four primary switches M, the other two of the four secondary switches D and the magnetic core 5 collaboratively. In other words, the four primary windings, the four secondary windings, the four primary switches M, the four secondary switches D and the magnetic core 5 are collaboratively formed as the two parallel-connected phase conversion circuits 21 and 22.

As mentioned above, a single magnetic core 5 is shared by the two parallel-connected phase conversion circuits 21 and 22, and the lower core part 52 is disposed between the first circuit board 3 and the second circuit board 4. Consequently, the power module 1 is cost-effective. Due to the arrangement of the single magnetic core 5, the primary windings and the secondary windings of the first phase conversion circuit 21 are magnetically coupled with each other, and the primary windings and the secondary windings of the second phase conversion circuit 22 are magnetically coupled with each other. According to a magnetic integration technology, the four primary windings and the four secondary windings of the power module 1 are formed as two magnetic integration transformers. Consequently, the volume of the transformer is smaller. Since the layout space of the transformers on the first circuit board 3 is small, more components can be disposed on the first circuit board 3 and the power density of the power module 1 is enhanced.

As mentioned above, the phase difference between the magnetic flux flowing through the primary winding on a specified lateral leg and the magnetic flux flowing through the primary winding on an adjacent lateral leg is any value in the range between 150 and 210 degrees, and the phase difference between the magnetic flux flowing through the primary winding on the specified lateral leg and the magnetic flux flowing through the primary winding on another adjacent lateral leg is any value in the range between 60 and 120 degrees. Consequently, the magnetic fluxes through the upper core part 51 and the lower core part 52 of the magnetic core 5 are distributed more uniformly. In such way, the thicknesses of the upper core part 51 and the lower core part 52 are reduced, and the size of the power module 1 is reduced.

Please refer to FIGS. 1, 2, 3 and 4 again. The lower core part 52 of the magnetic core 5 further includes a first lateral wall 521, a second lateral wall 522, a third lateral wall 523 and a fourth lateral wall 524. The first lateral wall 521 and the second lateral wall 522 are opposed to each other. The third lateral wall 523 and the fourth lateral wall 524 are opposed to each other. Moreover, the third lateral wall 523 and the fourth lateral wall 524 are arranged between the first lateral wall 521 and the second lateral wall 522. The first lateral leg 531 and the second lateral leg 532 of the magnetic core 5 are located beside the first lateral wall 521 of the lower core part 52. The third lateral leg 533 and the fourth lateral leg 534 of the magnetic core 5 are located beside the second lateral wall 522 of the lower core part 52. After the lateral legs 531, 532, 533 and 534 of the magnetic core 5 are penetrated through the corresponding first perforations 33 of the first circuit board 3, the first secondary switch D1 and the second secondary switch D2 of the first phase conversion circuit 21 are located beside first lateral wall 521 of the lower core part 52, and the third secondary switch D3 and the fourth secondary switch D4 of the second phase conversion circuit 22 are located beside second lateral wall 522 of the lower core part 52. In addition, the first secondary switch D1 is located beside the first lateral leg 531, the second secondary switch D2 is located beside the second lateral leg 532, the third secondary switch D3 is located beside the third lateral leg 533, and the fourth secondary switch D4 is located beside the fourth lateral leg 534. Since the secondary switches of each phase conversion circuit are located beside the corresponding lateral legs, the secondary switches of the phase conversion circuits are located beside the corresponding secondary windings. Since the AC loop of the secondary circuit is reduced, the AC loss of the power module 1 is reduced and the efficiency of the power module 1 is enhanced.

Please refer to FIG. 3 again. In this embodiment, the four secondary switches D1, D2, D3 and D4 are disposed on the first surface 31 of the first circuit board 3, and the secondary switches of different phase conversion circuits are located beside two opposite sides of the magnetic core 5. That is, the first secondary switch D1 and the second secondary switch D2 of the first phase conversion circuit 21 are located beside the first lateral wall 521 of the lower core part 52, and the third secondary switch D3 and the fourth secondary switch D4 of the second phase conversion circuit 22 are located beside the second lateral wall 522 of the lower core part 52. It is noted that numerous modifications and alterations may be made while retaining the teachings of the disclosure. In another embodiment, the two secondary switches of one of the two phase conversion circuits are disposed on the first surface 31 of the first circuit board 3, and the two secondary switches of the other of the two phase conversion circuits are disposed on the second surface 32 of the first circuit board 3. In another embodiment, the two secondary switches of one of the two phase conversion circuits are located beside a side of the magnetic core 5 and respectively disposed on the first surface 31 and the second surface 32 of the first circuit board 3, and the two secondary switches of the other of the two phase conversion circuits are located beside an opposite side of the magnetic core 5 and respectively disposed on the first surface 31 and the second surface 32 of the first circuit board 3.

Figure 9:
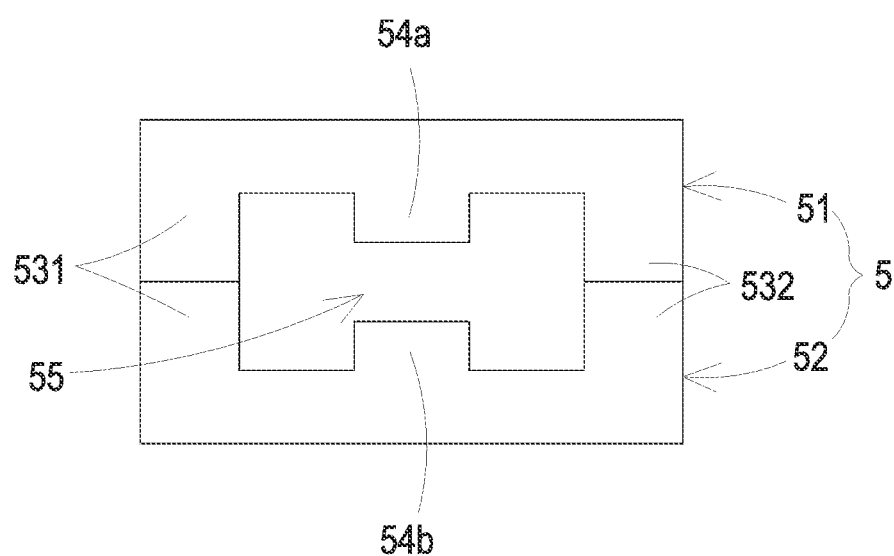
FIG. 9 is a schematic cross-sectional view illustrating the magnetic core of the power module as shown in FIG. 1.

FIG. 9 is a schematic cross-sectional view illustrating the magnetic core of the power module as shown in FIG. 1. Please refer to FIG. 9 and FIGS. 1 to 4. The middle leg 54 of the magnetic core 5 includes an upper middle leg part 54a and a lower middle leg part 54b. The upper middle leg part 54a and the lower middle leg part 54b are arranged between the four lateral legs. The second perforation 34 of the first circuit board 3 is aligned with the upper middle leg part 54a and the lower middle leg part 54b. When the upper core part 51 and the lower core part 52 are respectively disposed on the first surface 31 and the second surface 32 of the first circuit board 3, the upper middle leg part 54a and the lower middle leg part 54b are disposed in the second perforation 34 and accommodated within the first circuit board 31. Under this circumstance, an air gap 55 is formed between the upper middle leg part 54a and the lower middle leg part 54b.

In another embodiment, the middle leg 54 is an integral structure without the upper middle leg part 54a and the lower middle leg part 54b. That is, the middle leg 54 is formed on one of the upper core part 51 or the lower core part 52.

In another embodiment, the height of the air gap 55 of the magnetic core 5 is greater than the thickness of the first circuit board 3. Under this circumstance, the magnetic core 5 omits the middle leg 54, and the first circuit board 3 omits the second perforation 34. The air gap 55 is aligned with a clearance region (i.e., the region corresponding to the second perforation 34). Moreover, no electronic components, no planar windings or no conductive lines are included in the clearance region. Since the magnetic force lines passing through any lateral leg flow through the clearance region of the first circuit board 3, the cross section area of the magnetic force line path corresponding to the air gap 55 is retained and the magnetic loss of the power module 1 is reduced. Moreover, since the magnetic core 5 omits the middle leg 54, the fabricating cost of the magnetic core 5 is reduced and the fabricating process of the magnetic core 5 is simplified.

In another embodiment, the first lateral leg 531, the second lateral leg 532, the third lateral leg 533, the fourth lateral leg 534 and/or the middle leg 54 may be formed on the upper core part 51 only. The first lateral leg 531, the second lateral leg 532, the third lateral leg 533 and the fourth lateral leg 534 are penetrated through the first perforations 33 of the first circuit board 33. The middle leg 54 is penetrated through the second perforation 34. Consequently, the upper core part 51 and the lower core part 52 are combined together.

In another embodiment, the first lateral leg 531, the second lateral leg 532, the third lateral leg 533, the fourth lateral leg 534 and/or the middle leg 54 may be formed on the lower core part 52 only. The first lateral leg 531, the second lateral leg 532, the third lateral leg 533 and the fourth lateral leg 534 are penetrated through the first perforations 33 of the first circuit board 33. The middle leg 54 is penetrated through the second perforation 34. Consequently, the upper core part 51 and the lower core part 52 are combined together.

The power module 1 further includes the input capacitors C1 and C2. The input capacitors C1 and C2 are embedded in the second circuit board 4 or disposed on the first surface 41 of the second circuit board 4.

Please refer to FIGS. 1, 2, 3 and 4 again. In an embodiment, the first secondary switch D1, the second secondary switch D2, the third secondary switch D3 and the fourth secondary switch D4 are disposed on the second surface 32 of the first circuit board 3. The connection element 6 includes two first power connectors 61. The two first power connectors 61 are disposed on the second surface 32 of the first circuit board 3. One of the two first power connectors 61 is arranged between the first secondary switch D1 and the second secondary switch D2. The other of the two first power connectors 61 is arranged between the third secondary switch D3 and the fourth secondary switch D4. When the first circuit board 3 and the second circuit board 4 are combined together, the two first power connectors 61 are connected with the first surface 41 of the second circuit board 4. Each first power connector 61 includes a first connector unit 61a and a second connector unit 61b. The first connector unit 61a and the second connector unit 61b of one of the two first power connectors 61 are located at the output side of the first phase conversion circuit 21 and respectively served as the positive output terminal Vo+ and the negative output terminal Vo−. The first connector unit 61a and the second connector unit 61b of the other of the two first power connectors 61 are located at the output side of the second phase conversion circuit 22 and respectively served as the positive output terminal Vo+ and the negative output terminal Vo−. The two first power connectors 61 are disposed on the second surface 32 of the first circuit board 3 and aligned with the corresponding secondary switches D. Consequently, the distance between each first power connector 61 and the corresponding secondary switch D or the distance between each first power connector 61 and the corresponding secondary winding is the shortest. Since the first power connector 61 is connected with the corresponding secondary switch D and the corresponding secondary winding through the shortest traces, the wiring loss is reduced.

Figure 10A:
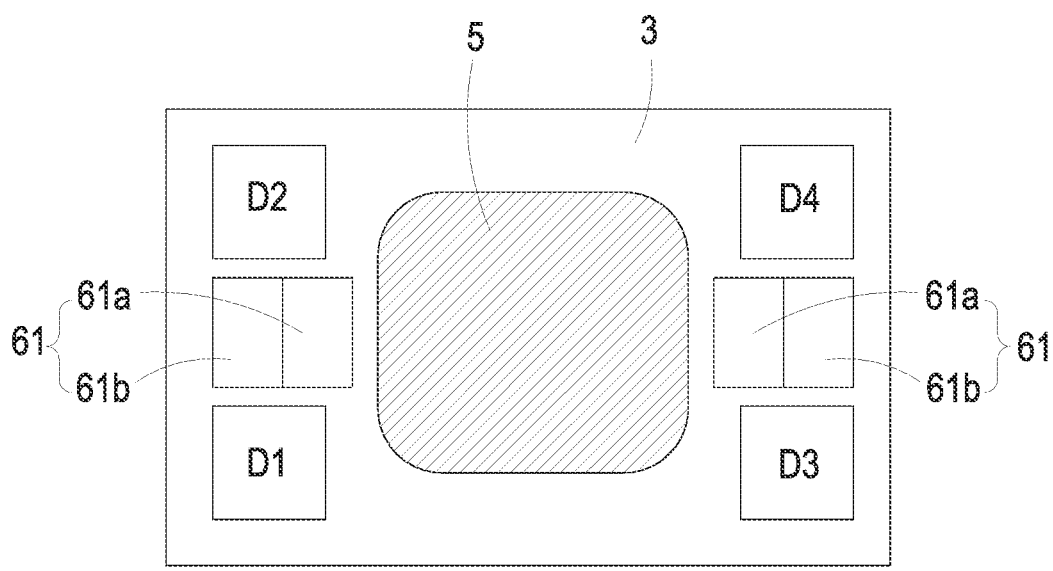
FIGS. 10A, 10B and 10C schematically illustrate three examples of the layout relationships between the magnetic core, the secondary switches and the first power connectors of the power module according to the embodiment of the present disclosure.
Figure 10B:
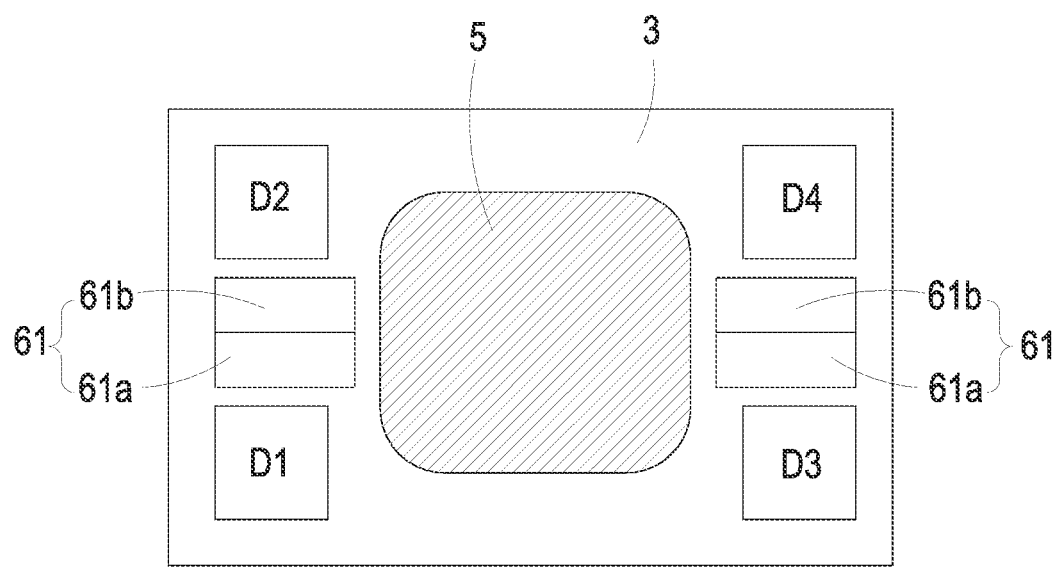
Figure 10C:
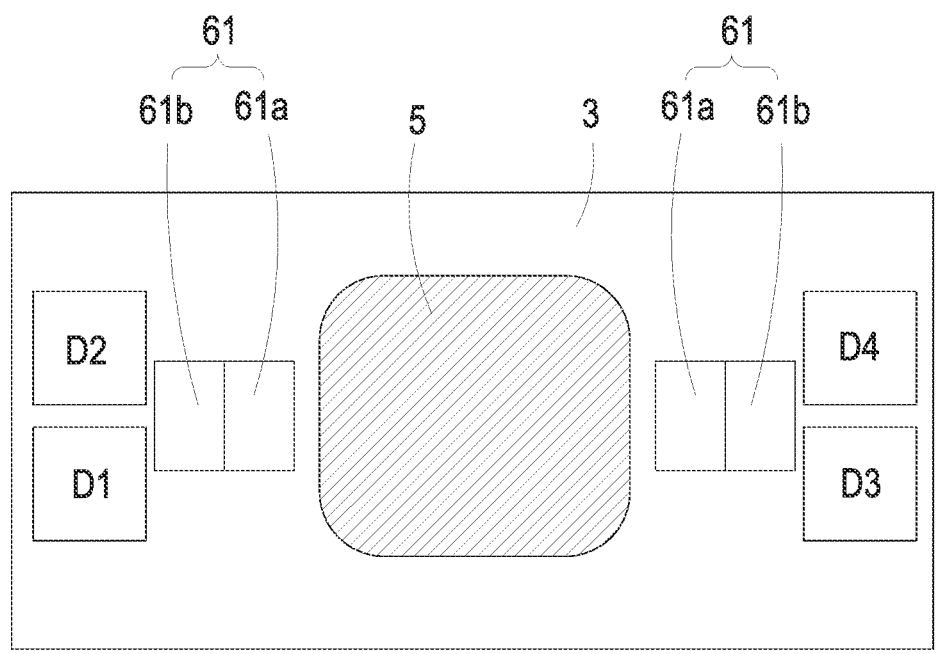

FIGS. 10A, 10B and 10C schematically illustrate three examples of the layout relationships between the magnetic core, the secondary switches and the first power connectors of the power module according to the embodiment of the present disclosure.

In an embodiment, as shown in FIG. 10A, one of the two first power connectors 61 is arranged between the first secondary switch D1 and the second secondary switch D2, and the other of the two first power connectors 61 is arranged between the third secondary switch D3 and the fourth secondary switch D4. The two first power connectors 61 are located beside two opposite sides of the magnetic core 5. As shown in FIG. 10A, the two first connector units 61a of the two first power connectors 61 are located near the magnetic core 5, and the two second connector units 61b of the two first power connectors 61 are located away from the magnetic core 5. Due to this arrangement, the wiring loss is reduced.

In other embodiment, as shown in FIG. 10B, one of the two first power connectors 61 is arranged between the first secondary switch D1 and the second secondary switch D2, and the other of the two first power connectors 61 is arranged between the third secondary switch D3 and the fourth secondary switch D4. The first connector unit 61a and the second connector unit 61b of one of the two first power connectors 61 are respectively located beside the first secondary switch D1 and the second secondary switch D2, and the first connector unit 61a and the second connector unit 61b of the other of the two first power connectors 61 are respectively located beside the third secondary switch D3 and the fourth secondary switch D4. Due to this arrangement, the distance between each first power connector and the corresponding secondary switch or the distance between each first power connector and the corresponding secondary winding is the shortest.

In some other embodiments, as shown in FIG. 10C, one of the two first power connectors 61 is arranged between the first secondary switch D1 and the magnetic core 5 and arranged between the second secondary switch D2 and the magnetic core 5. The first connector unit 61a of the first power connector 61 served as the positive output terminal Vo+ is located beside the magnetic core 5, and the second connector unit 61b of the first power connector 61 served as the negative output terminal Vo− is located beside the first secondary switch D1 and the second secondary switch D2. In addition, the other of the two first power connectors 61 is arranged between the third secondary switch D3 and the magnetic core 5 and arranged between the fourth secondary switch D4 and the magnetic core 5. The first connector unit 61a of the first power connector 61 served as the positive output terminal Vo+ is located beside the magnetic core 5, and the second connector unit 61b of the first power connector 61 served as the negative output terminal Vo− is located beside the third secondary switch D3 and the fourth secondary switch D4. Due to this arrangement, the distance between each first power connector and the corresponding secondary switch or the distance between each first power connector and the corresponding secondary winding is the shortest.

Please refer to FIGS. 1 to 4 again. The connection element 6 further includes two second power connectors 62. Each second power connector 62 includes a third connector unit 62a and a fourth connector unit 62b. The third connector unit 62a and the fourth connector unit 62b are disposed on the second surface 32 of the first circuit board 3. The first terminal of the third connector unit 62a is electrically connected with the first terminal of the corresponding primary winding branch circuit. The first terminal of the fourth connector unit 62b is electrically connected with the second terminal of the corresponding primary winding branch circuit. When the first circuit board 3 and the second circuit board 4 are combined together, the second terminal of the third connector unit 62a and the second terminal of the fourth connector unit 62b are connected with a corresponding node on the first surface 41 of the second circuit board 4. Consequently, the first circuit board 3 and the second circuit board 4 are electrically connected with each other.

The power module 1 further includes a plurality of first soldering pads 71, a plurality of second soldering pads 72 and a plurality of conductive holes 73. The plurality of first soldering pads 71 are disposed on the first surface 41 of the second circuit board 4. When the first circuit board 3 and the second circuit board 4 are combined together, the first soldering pads 71 are connected with the corresponding first power connectors 61. Consequently, the first soldering pads 71 are electrically connected with the positive output terminal Vo+ (i.e., the first connector units 61a) and the negative output terminal Vo− (i.e., the second connector units 61b). The plurality of conductive holes 73 are formed in the first surface 41 of the second circuit board 4. Moreover, portions of the conductive holes 73 are electrically connected with the midpoints of the corresponding primary switch bridge arms on the second circuit board 4, and the other portions of the conductive holes 73 are electrically connected with the midpoints of the corresponding capacitor bridge arms on the second circuit board 4. When the first circuit board 3 and the second circuit board 4 are combined together, the second power connectors 62 are fixed in and electrically connected with the corresponding conductive holes 73. That is, the second terminals of the third connector units 62a are fixed in the corresponding conductive holes 73 and electrically connected with the midpoints of the corresponding primary switch bridge arms. The second terminals of the fourth connector units 62b are fixed in the corresponding conductive holes 73 and electrically connected with the midpoints of the corresponding capacitor bridge arms. The plurality of second soldering pads 72 are disposed on the second surface 42 of the second circuit board 4 and electrically connected with the system board. Moreover, some of the second soldering pads 72 are electrically connected with the corresponding first soldering pads 71 through the traces within the second circuit board 4. In some embodiments, portions of the second soldering pads 72 are used as the output pad of the output side of the power module 1 or the input pad of the input side of the power module 1. Consequently, the electric power is outputted from the power module 1 to the system board through the output pad, and the electric power is inputted from the system board to the power module 1 through the input pad. Preferably, some of the second soldering pads 72 are aligned with the corresponding first soldering pads 71. Consequently, the distance between each second soldering pad 72 and the corresponding first soldering pad 71 is the shortest, and the second soldering pad 72 is electrically connected with the corresponding first soldering pad 71 through the short trace of the second circuit board 4. Preferably, some other second soldering pads 72 are aligned with the corresponding primary switches M. Consequently, the distance between each second soldering pad 72 and the corresponding primary switch M is the shortest, and the second soldering pad 72 is electrically connected with the corresponding primary switch M through the short trace of the second circuit board 4. In such way, the wiring loss is reduced. It is noted that the positions of the first soldering pads 71 and the second soldering pads 72 may be varied according to the requirement of the system board or the layout structure of the power module 1.

In an embodiment, the output capacitors Cout1 and Cout2 are disposed on the first circuit board 3. The first terminals (e.g., positive terminals) of the output capacitors Cout1 and Cout2 are electrically connected with the first terminals of the corresponding first connector units 61a. The second terminals (e.g., negative terminals) of the output capacitors Cout1 and Cout2 are electrically connected with the first terminals of the corresponding second connector units 61b. In another embodiment, the output capacitors Cout1 and Cout2 are disposed on the second circuit board 4. The first terminals (e.g., positive terminals) of the output capacitors Cout1 and Cout2 are electrically connected with the second terminals of the corresponding first connector units 61a. The second terminals (e.g., negative terminals) of the output capacitors Cout1 and Cout2 are electrically connected with the second terminals of the corresponding second connector units 61b.

Please refer to FIGS. 1 to 4 again. The connection element 6 further includes a plurality of signal connectors 63. The plurality of signal connectors 63 are disposed on the second surface 32 of the first circuit board 3. When the first circuit board 3 and the second circuit board 4 are combined together, the signal connectors 63 are connected with the first surface 41 of the second circuit board 4. Consequently, the control signals PWM1, PWM2, PWM3, PWM4 and other signals can be transferred between the first circuit board 3 and the second circuit board 4. Moreover, since the first circuit board 3 and the second circuit board 4 are supported by the signal connectors 63, the reliability of the power module 1 is enhanced. It is noted that the shapes and sizes of the first power connectors 61, the second power connectors 62 and the signal connectors 63 are not restricted.

In some embodiments, the first soldering pads 71 are replaced by conductive holes, and the conductive holes 73 are replaced by soldering pads.

As mentioned above, the four primary switches M are disposed on the first surface 41 of the second circuit board 4, and the second surface 42 of the second circuit board 4 is disposed on the system board. Since the four primary switches M are electrically connected with the system board through the short trace of the second circuit board 4, the wiring loss is reduced. In addition, the heat from the four primary switches M can be transferred to the system board through the second soldering pads 72 on the second surface 42 of the second circuit board 4 and dissipated away. In some embodiments, the power module 1 further includes an input filter capacitor and an input filter inductor. The input filter capacitor and the input filter inductor are connected with the four primary switches M to achieve the filtering efficacy. Since the trace of the second circuit board 4 for connecting the four primary switches M with the system board is short and wide, the input filter capacitor and the input filter inductor can be disposed on the system to be connected with the four primary switches M. Consequently, the volume of the power module 1 is further reduced.

Figure 11:
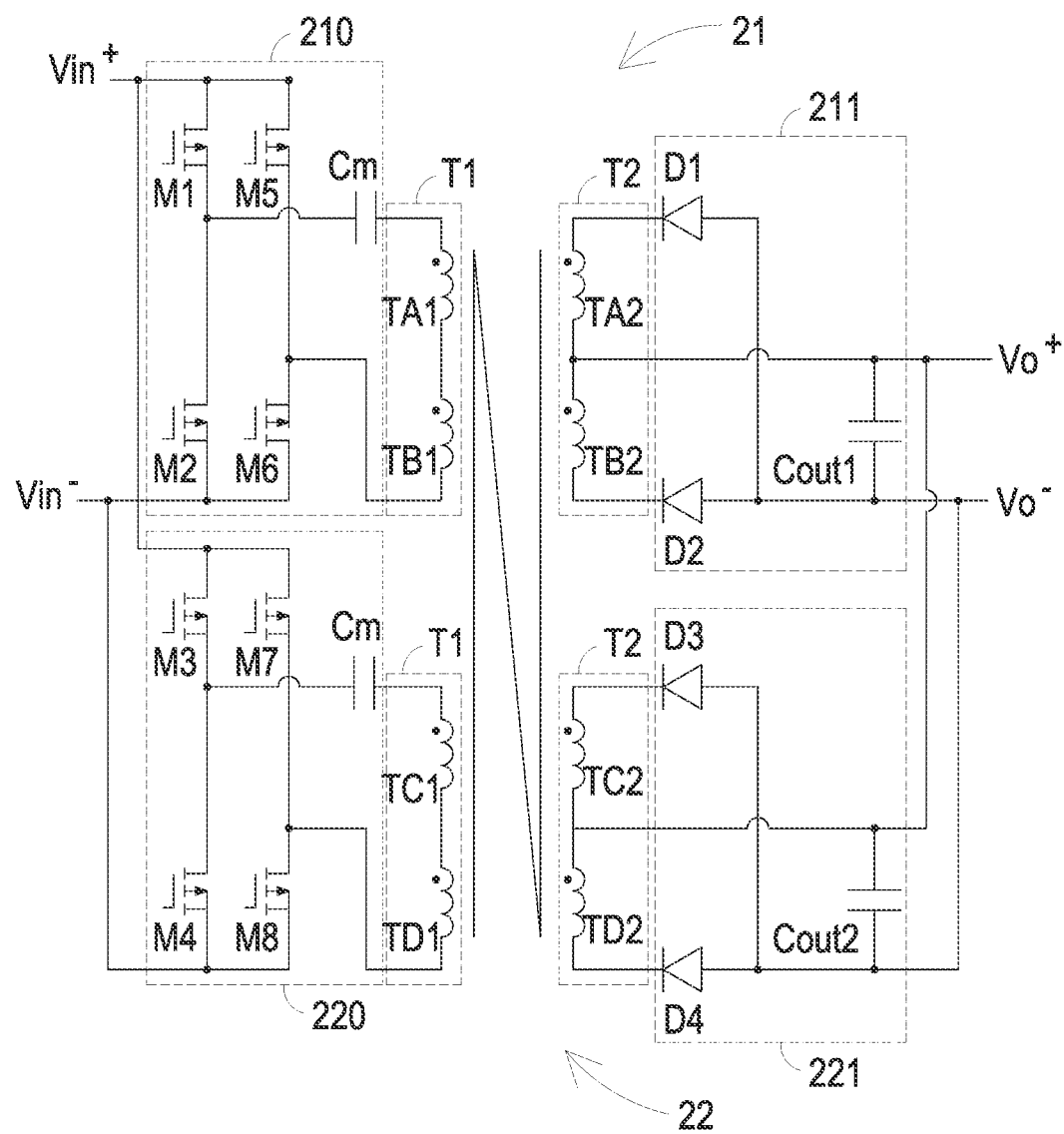
FIG. 11 is an equivalent circuit of a power module according to another embodiment of the present disclosure.

FIG. 11 is an equivalent circuit of a power module according to another embodiment of the present disclosure. In comparison with the power module 1 of FIG. 6, the circuitry structure of the primary side of the power module 1a of this embodiment is distinguished. The primary circuit 210 of the first phase conversion circuit 21 further includes a fifth primary switch M5 and a sixth primary switch M6, and the primary circuit 220 of the second phase conversion circuit 22 further includes a seventh primary switch M7 and an eighth primary switch M8.

The fifth primary switch M5 and the sixth primary switch M6 are electrically connected with each other and collaboratively defined as an additional first primary switch bridge arm. That is, the second terminal of the fifth primary switch M5 and the first terminal of the sixth primary switch M6 are connected to a midpoint of the additional first primary switch bridge arm. The first terminal of the fifth primary switch M5 is electrically connected with the first terminal of the first primary switch M1. The second terminal of the sixth primary switch M6 is electrically connected with the second terminal of the second primary switch M2. Similarly, a first primary winding branch circuit is defined by the first primary winding TA1 and the second primary winding TB1 collaboratively. The second terminal of the first primary winding branch circuit is electrically connected with the midpoint of the additional first primary switch bridge arm.

The seventh primary switch M7 and the eighth primary switch M8 are electrically connected with each other and collaboratively defined as an additional second primary switch bridge arm. That is, the second terminal of the seventh primary switch M7 and the first terminal of the eighth primary switch M8 are connected to a midpoint of the additional second primary switch bridge arm. The first terminal of the seventh primary switch M7 is electrically connected with the first terminal of the third primary switch M3. The second terminal of the eighth primary switch M8 is electrically connected with the second terminal of the fourth primary switch M4. Similarly, a second primary winding branch circuit is defined by the third primary winding TC1 and the fourth primary winding TD1 collaboratively. The second terminal of the second primary winding branch circuit is electrically connected with the midpoint of the additional second primary switch bridge arm.

Similarly, the plurality of conductive holes 73 are formed in the first surface 41 of the second circuit board 4. Moreover, portions of the conductive holes 73 are electrically connected with the midpoints of the corresponding primary switch bridge arms on the second circuit board 4. However, in comparison with the embodiment of FIGS. 1 to 4, the other portions of the conductive holes 73 are electrically connected with the midpoints of the corresponding additional primary switch bridge arms on the second circuit board 4. The other components and the relationships are similar to those of the above embodiment, and not redundantly described herein. In some embodiments, the first phase conversion circuit 21 and the second phase conversion circuit 22 are dual-flyback circuits, duty-cycle adjustable circuits or fixed-ratio conversion circuits.

Please refer to FIGS. 6 and 11 again. As shown in FIG. 6, the primary circuit of each phase conversion circuit in the power module 1 is a half-bridge circuit. Moreover, the input capacitors C1, C2, C3 and C4 can be used to block the DC currents. As shown in FIG. 11, each phase conversion circuit of the power module 1a further includes a blocking capacitor Cm. The blocking capacitor Cm is serially connected with the corresponding primary winding. Due to the input capacitors C1, C2, C3 and C4 and the blocking capacitor Cm, the magnitude of the DC current flowing through the first secondary winding TA2 and the magnitude of the DC current flowing through the second secondary winding TB2 are equal. As a consequence, the closed DC magnetic flux loop is not formed by the first secondary winding TA2, the first lateral leg 531, the second secondary winding TB2 and the second lateral leg 532. Similarly, the magnitude of the DC current flowing through the third secondary winding TC2 and the magnitude of the DC current flowing through the fourth secondary winding TD2 are equal. As a consequence, the closed DC magnetic flux loop is not formed by the third secondary winding TC2, the third lateral leg 533, the fourth secondary winding TD2 and the fourth lateral leg 534.

In some situations, there are distribution parameters between the first phase conversion circuit 21 and the second phase conversion circuit 22. Consequently, the magnitude of the DC current flowing through the first secondary winding TA2 and the magnitude of the DC current flowing through the third secondary winding TC2 are not equal, and the DC magnetic flux through the first lateral leg 531 and the DC magnetic flux through the third lateral leg 533 are not equal. Under this circumstance, the difficulty of designing the magnetic core 5 is increased. For solving this drawback, the controller 8 of the power module 1 further includes a current-sharing circuit (not shown). The current-sharing circuit samples two corresponding current signals from the first phase conversion circuit 21 and the second phase conversion circuit 22. For example, the current signals include the input currents inputted into the two phase conversion circuits, the currents flowing the primary windings, the currents flowing through the secondary windings or the output currents. After the controller 8 samples the current signals, the pulse width modulation signals for controlling the first phase conversion circuit 21 and the second phase conversion circuit 22 are generated. Consequently, the magnitude of the DC current flowing through the first secondary winding TA2 and the magnitude of the DC current flowing through the third secondary winding TC2 can be equal, and the magnitude of the DC current flowing through the second secondary winding TB2 and the magnitude of the DC current flowing through the fourth secondary winding TD2 can be equal. Consequently, the purpose of sharing currents between the first phase conversion circuit 21 and the second phase conversion circuit 22 can be achieved. In addition, the DC magnetic flux through the first lateral leg 531 and the DC magnetic flux through the third lateral leg 533 are equal, and the DC magnetic flux through the second lateral leg 532 and the DC magnetic flux through the fourth lateral leg 534 are equal. Consequently, the method of designing the magnetic core 5 is simplified.

In another embodiment, the power module 1, 1a includes the first circuit board 3, but the power module 1, 1a omits the second circuit board 4. Under this circumstance, the primary switches are disposed on the first circuit board 3. The installation positions of the primary switches may be determined according to the practical requirements.

In another embodiment, the second circuit board 4 of the power module 1, 1a is a system board. The primary switches of the primary switch bridge arm, the capacitors of the capacitor bridge arm and the input capacitors are disposed on the system board. The first terminal of the connection element 6 is disposed on the second surface 32 of the first circuit board 3. The second terminal of the connection element 6 is fixed on the corresponding soldering pads or conductive holes of the system board and electrically connected with the corresponding components of the system board. Under this circumstance, the system board omits the second soldering pads.

From the above descriptions, the present disclosure provides the power module. Since a single magnetic core is shared by the two parallel-connected phase conversion circuits, the power module is cost-effective. Due to the arrangement of the single magnetic core, the primary windings and the secondary windings of the first phase conversion circuit are magnetically coupled with each other, and the primary windings and the secondary windings of the second phase conversion circuit are magnetically coupled with each other. According to a magnetic integration technology, the four primary windings and the four secondary windings of the power module are formed as two magnetic integration transformers. Consequently, the volume of the transformer is smaller. Since the layout space of the transformers on the first circuit board is small, more components can be disposed on the first circuit board and the power density of the power module is enhanced. Since the primary switches are disposed on the second circuit board, the first circuit board has more space to install the primary windings and the secondary windings. In such way, the widths of the traces for the primary windings and the secondary windings can be increased. Consequently, the power loss of the transformer is reduced, and the power density of the power module is increased. Moreover, the phase difference between the magnetic flux flowing through the primary winding on a specified lateral leg and the magnetic flux flowing through the primary winding on an adjacent lateral leg is any value in the range between 150 degrees and 210 degrees, and the phase difference between the magnetic flux flowing through the primary winding on the specified lateral leg and the magnetic flux flowing through the primary winding on another adjacent lateral leg is any value in the range between 60 degrees and 120 degrees. Consequently, the magnetic fluxes through the upper core part and the lower core part of the magnetic core are distributed more uniformly. In such way, the thicknesses of the upper core part and the lower core part are reduced, and the size of the power module is reduced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetic assembly, comprising:
   a magnetic core comprising an upper core part, a lower core part and four lateral legs, wherein the four lateral legs are disposed between the upper core part and the lower core part;
   four primary windings comprising a first primary winding, a second primary winding, a third primary winding and a fourth primary winding, wherein the first primary winding and the second primary winding are connected in series, and winding directions of the first primary winding and the second primary winding are opposite, the third primary winding and the fourth primary winding are connected in series, and winding directions of the third primary winding and the fourth primary winding are opposite; and
   four secondary windings, wherein each of the four secondary windings and the corresponding primary winding of the four primary windings are magnetically coupled with each other and wound on the corresponding lateral leg of the four lateral legs, so that a transformer is defined by the magnetic core, one of the four secondary windings and the corresponding primary winding of the four primary windings collaboratively,
   wherein winding directions of the four secondary windings on the corresponding lateral legs are identical, in response to an AC voltage across each of the four primary windings, an AC magnetic flux flows through the corresponding lateral leg, a phase difference exists between the AC magnetic flux flowing through any two of the four lateral legs, wherein a phase difference exists between an AC voltage applied across the first primary winding and the second primary winding connected in series and an AC voltage ap lied across the third primary winding and the fourth primary winding connected in series, wherein a phase difference between a magnetic flux flowing through a specified lateral leg of the four lateral legs and a magnetic flux flowing through an adjacent lateral leg is any value in the range between 150 degrees and 210 degrees, and a phase difference between the magnetic flux flowing through the specified lateral leg and the magnetic flux flowing through another adjacent lateral leg is any value in the range between 60 degrees and 120 degrees.

2. The magnetic assembly according to claim 1, wherein the magnetic core further comprises a middle leg, wherein the middle leg is disposed between the upper core part and the lower core part, and the four lateral legs are arranged around the middle leg.

3. The magnetic assembly according to claim 2, wherein the middle leg has a stepped air gap and is made of ferrite, or the middle leg has a distributed air gap and is made of iron powder.

4. The magnetic assembly according to claim 1, wherein the fourth lateral legs include a first lateral leg, a second lateral leg, a third lateral leg and a fourth lateral leg in a quadrilateral arrangement, wherein the first lateral leg and the fourth lateral leg are respectively located at two opposite corners along a diagonal line of the quadrilateral arrangement, the second lateral leg and the third lateral leg are respectively located at two opposite corners along another diagonal line of the quadrilateral arrangement, wherein the first lateral leg is located beside the second lateral leg and the third lateral leg, and the fourth lateral leg is located beside the second lateral leg and the third lateral leg.

5. The magnetic assembly according to claim 4, wherein a phase difference between a magnetic flux flowing through the first lateral leg and a magnetic flux flowing through the second lateral leg is 180 degrees, a phase difference between the magnetic flux flowing through the first lateral leg and a magnetic flux flowing through the third lateral leg is 90 degrees, and a phase difference between the magnetic flux flowing through the first lateral leg and a magnetic flux flowing through the fourth lateral leg is 270 degrees.

6. The magnetic assembly according to claim 5, wherein the four secondary windings include a first secondary winding, a second secondary winding, a third secondary winding and a fourth secondary winding, which are respectively wound on the first lateral leg, the second lateral leg, the third lateral leg and the fourth lateral leg, wherein the first secondary winding and the second secondary winding are collaboratively formed as a first center-tapped structure, and the third secondary winding and the fourth secondary winding are collaboratively formed as a second center-tapped structure.

* * * * *